(12) United States Patent
Liu et al.

(10) Patent No.: US 10,013,007 B2
(45) Date of Patent: Jul. 3, 2018

(54) HYBRID INTERLEAVING STRUCTURE WITH ADAPTIVE PHASE LOCKED LOOP FOR VARIABLE FREQUENCY CONTROLLED SWITCHING CONVERTER

(71) Applicant: Virginia Tech Intellectual Properties, Inc., Blacksburg, VA (US)

(72) Inventors: Pei-Hsin Liu, Blacksburg, VA (US); Qiang Li, Blacksburg, VA (US); Fred C. Lee, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 170 days.

(21) Appl. No.: 14/674,680

(22) Filed: Mar. 31, 2015

(65) Prior Publication Data
US 2015/0277460 A1 Oct. 1, 2015

Related U.S. Application Data

(60) Provisional application No. 61/973,590, filed on Apr. 1, 2014.

(51) Int. Cl.
*H02M 3/158* (2006.01)
*G05F 1/56* (2006.01)
*H03L 7/06* (2006.01)

(52) U.S. Cl.
CPC ............ *G05F 1/56* (2013.01); *H02M 3/1584* (2013.01); *H03L 7/06* (2013.01); *H02M 2003/1586* (2013.01)

(58) Field of Classification Search
None
See application file for complete search history.

(56) References Cited

U.S. PATENT DOCUMENTS

| | | | |
|---|---|---|---|
| 7,268,526 B1* | 9/2007 | Smith | H02M 3/156 323/284 |
| 2003/0184394 A1* | 10/2003 | Lin | H03K 3/0322 331/100 |
| 2005/0001597 A1* | 1/2005 | Walters | H02J 1/102 323/222 |
| 2005/0258907 A1* | 11/2005 | Zachan | H03L 7/0893 331/16 |

(Continued)

*Primary Examiner* — Jeffrey Gblende
(74) *Attorney, Agent, or Firm* — Whitham, Curtis & Cook, P.C.

(57) ABSTRACT

In a multi-phase power converter using a phase-locked loop (PLL) arrangement for interleaving of pulse frequency modulated (PFM) pulses of the respective phases, improved transient response, improved stability of high bandwidth output voltage feedback loop, guaranteed stability of the PLL loop and avoidance of jittering and phase cancellation issues are achieved by anchoring the bandwidth at the frequency of peak phase margin. This methodology is applicable to multi-phase power conveners of any number of phases and any known or foreseeable topology for individual phases and is not only applicable to power converters operating under constant on-time control, but is extendable to ramp pulse modulation (RPM) control and hysteresis control. Interleaving of pulses from all phases is simplified through use of phase managers with a reduced number of PLLS using hybrid interleaving arrangements that do not exhibit jittering even when ripple is completely canceled.

18 Claims, 28 Drawing Sheets

(56) References Cited

U.S. PATENT DOCUMENTS

| | | | | |
|---|---|---|---|---|
| 2012/0319786 A1* | 12/2012 | kumar | ............... | H03L 7/0896 331/1 R |
| 2014/0217996 A1* | 8/2014 | Peker | ............ | H02M 3/1582 323/271 |
| 2015/0028924 A1* | 1/2015 | Chao | .......... | H03K 4/90 327/133 |

* cited by examiner

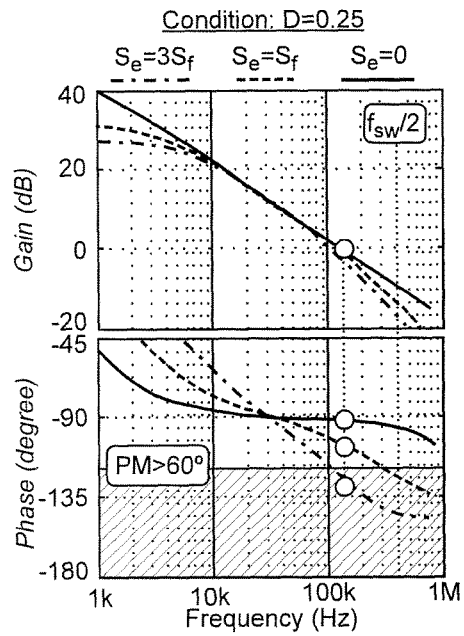
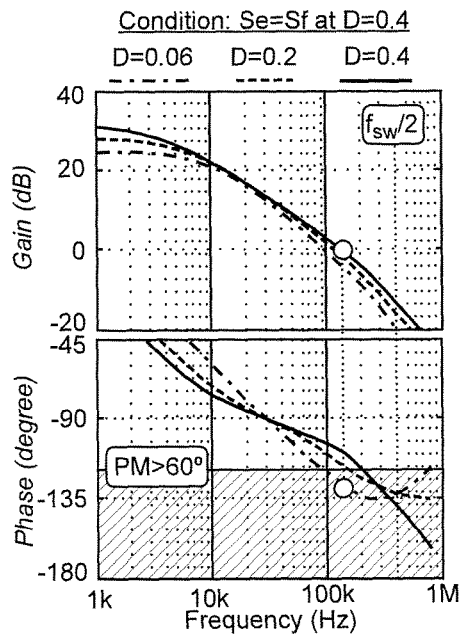
Figure 1A
Figure 1B
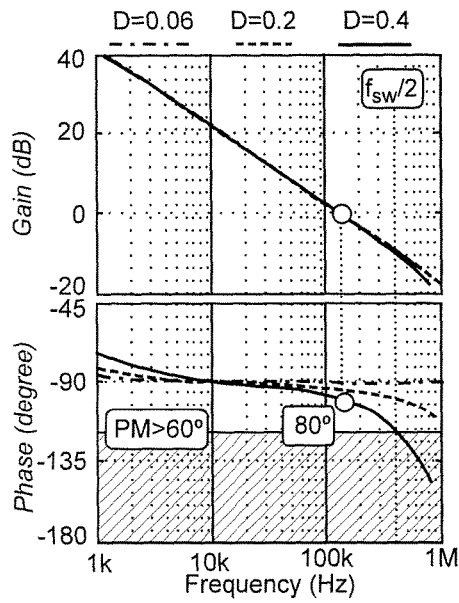
Figure 1C

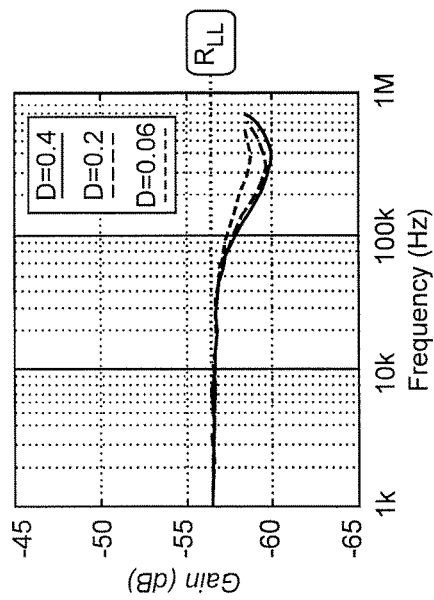
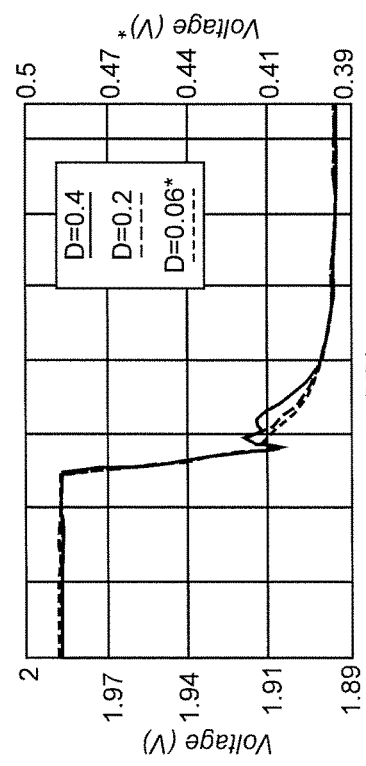
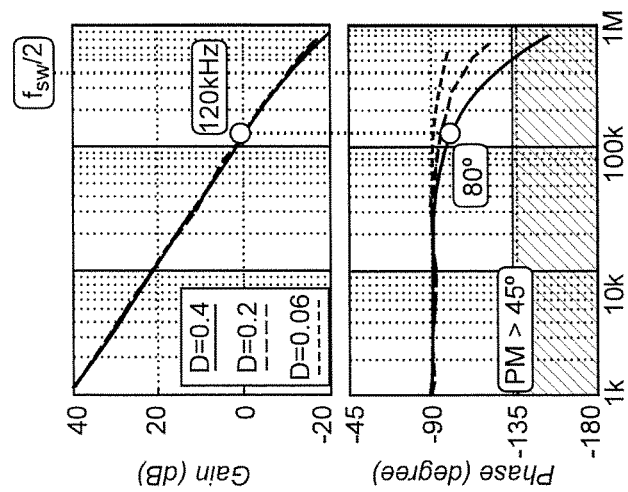
Figure 32B
Figure 32C
Figure 32A

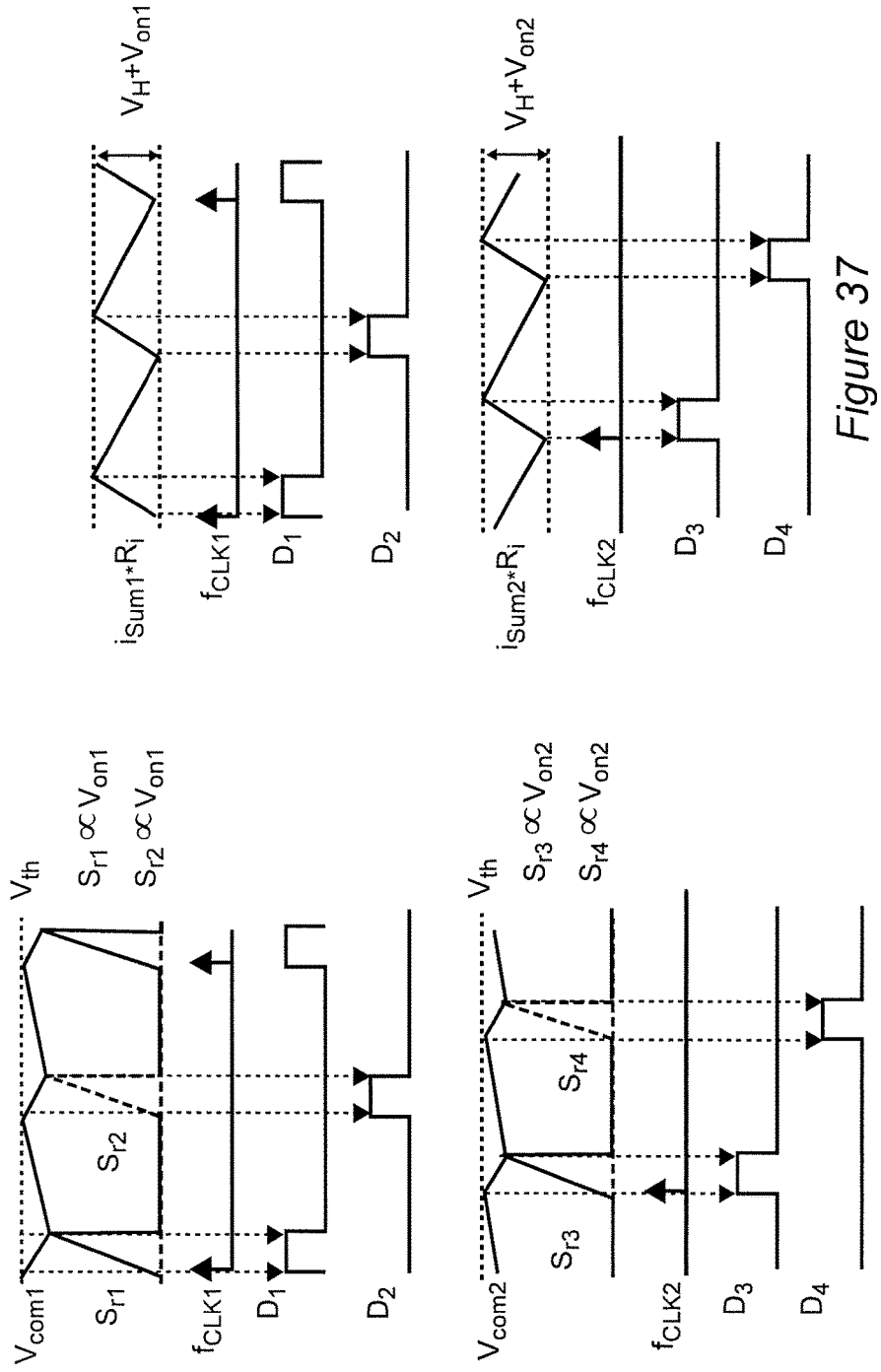

HYBRID INTERLEAVING STRUCTURE WITH ADAPTIVE PHASE LOCKED LOOP FOR VARIABLE FREQUENCY CONTROLLED SWITCHING CONVERTER

CROSS-REFERENCE TO RELATED APPLICATIONS

This application claims benefit of priority of U.S. Provisional Application 61/973,590, filed Apr. 1, 2014, which is hereby incorporated by reference in its entirety.

FIELD OF THE INVENTION

The present invention generally relates to variable frequency controlled switching power converters and, more particularly, to assuring stability and adequate phase margins of both low bandwidth phase locked loops (PLLs) and high bandwidth output voltage feedback loops, particularly in multi-phase variable frequency controlled power converters.

BACKGROUND OF THE INVENTION

Variable frequency control has been widely used in DC-DC power converters since variable frequency control provides not only improved light load efficiency but also fast transient response and high bandwidth design to reduce capacitance requirements for filter capacitors; saving cost and size. The light load efficiency is increased by reducing switching frequency, $f_{sw}$, when the load current decreases and thus reduces switching losses. The transient response is improved by allowing $f_{sw}$ to change quickly during a rapid load current change. The higher control bandwidth on the output voltage feedback loop is obtained due to eliminating the aliasing effect of constant frequency control. The three most common types of variable frequency control are constant on-time (COT), ramp pulse modulation (RPM) control and hysteresis control.

However, wide variation of switching frequency in response to variation in input or output voltage change, as is presented, for example, by state-of-the-art laptop computer processor designs which use narrow VDC (NVDC) techniques to lower the input voltage range that can be supplied from serially connected battery cells, is inherent in variable frequency controlled power converters. For example, in view of possible scaling of output voltage operating points, Vo of a DC-DC converter from 0.5 V to 2.0 V, the duty cycle, D=Vo/Vin, for a buck converter, can range from 0.06 to 0.4. Using COT control, since on-time, $T_{on}$, is fixed, the frequency can vary over a range approaching a decade in frequency (e.g. from 800 kHz at D=0.06 to 5.3 MHZ at D=0.4).

However, such a wide frequency range causes excessive power losses and problems with achieving correct interleaving angle for multi-phase operation. To reduce such power losses, it is known to provide a frequency regulation loop to slowly adjust $T_{on}$ to maintain operation in a manner somewhat similar to constant frequency operation. In other words, when duty cycle is increased or decreased, the frequency change is reduced by changing the on-time slowly such that the frequency is held to a more nearly constant value to compensate for the difference between the required frequency for COT operation and the frequency at which the converter actually operates, referred to as pulse frequency modulation (PFM). For a given duty cycle, the switching frequency varies inversely with $T_{on}$ and thus the switching frequency can be adjusted by changing $T_{on}$.

For multi-phase operation where a plurality of power converters are essentially connected in parallel, it is common practice to interleave the pulses created by the switching within the respective power converters to equalize time intervals between pulse frequency modulation (PFM) pulses from respective converters. Arrangements for such interleaving with a frequency regulation loop generally fall into one of two types: pulse distribution structures and phase-locked loop (PLL) structures.

In a pulse distribution structure, the frequency regulation loop is implemented by $V_{in}$ and Vo feed forward to the on-time generator. The interleaving is achieved easily by distributing the pulses which result from the intersection of the sum of inductor currents of all phases and the control voltage, $V_c$. However, transient response is slow because the phase manager (sometimes referred to as a phase splitter) arrangement, as will be discussed below, cannot immediately synchronize PFM pulses of all phases during step-up load transients. Further, pulse distribution structures exhibit noise sensitivity due to ripple cancellation between the sum of the instantaneous currents delivered by the respective phases, particularly since the power delivery pulses do not overlap. At operating points where ripple is substantially canceled, low-level noise can cause duty cycle jittering and results in higher output voltage ripple. Adding an external ramp voltage having a slope $S_e$ can reduce jittering but the strong phase delay caused by using the ramp signal reduces the phase margin of the output voltage feedback loop and limits bandwidth. For example, FIG. 1A shows the resultant loop gain of output voltage feedback loop ($T_2$), which indicates that even a small $S_e$ reduces the phase margin to less than 60° when the bandwidth (e.g. the frequency that produces zero gain in the transfer function of the loop, also referred to as the crossover point) is designed close to $f_{sw}/6$. Also, when the duty cycle changes, the phase delay effect becomes stronger. Thus, high bandwidth design becomes more difficult for a wide range of duty cycle, as shown in FIG. 1B. As a result, poor transient performance and poor stability margin requires large output capacitance for acceptable operation of pulse distribution structures. The same issues are present in COT control, RPM control and hysteresis control.

On the other hand, phase locked loop (PLL) structures have the advantages of exhibiting faster transient response, less noise sensitivity and higher bandwidth of the output voltage feedback loop. In PLL structures, a PLL is provided as a frequency regulation loop in each phase and is arranged to adjust $T_{on}$ to track a fixed frequency clock signal. Interleaving is achieved by shifting the phase of the fixed frequency clock applied (and to which respective PLLs of each phase are synchronized/locked) by an angle determined by the number of phases employed. The modulation is determined by the intersection of individual (rather than total, as in pulse distribution structures) phase current and control voltage, $V_c$, such that the $V_c$ increment during a large step-up load transient causes early intersection with the current feedback signals of each phase to be closely spaced in time; forcing the PFM pulses to immediately begin to overlap during large load transients. Further, PLL structures do not exhibit a ripple cancellation effect, do not require an external ramp signal for reliable operation and are less sensitive to noise than pulse distribution structures. Without the requirement for an external ramp signal, it is possible to maintain sufficient phase margin for stability in a high bandwidth design of the output voltage feedback loop as shown in FIG. 1C. PLL structures are known for use with COT control and hysteresis control. However, no applications of PLL structures are known or found in the literature for RPM control.

However, two drawbacks limit the adoption of PLL structures. Compensation of the PLL loop to be stable is difficult as will be discussed in greater detail below. Also, each phase requires a PLL and a high speed current loop comparator which lead to much increased complexity and cost as the number of phases is increased. Additionally, a PLL that alters on-time in order to track the frequency of a fixed frequency clock is, itself, of substantial complexity as will be discussed in greater detail below.

SUMMARY OF THE INVENTION

It is therefore an object of the present invention to provide an adaptive phase locked loop (PLL) that is made unconditionally stable through anchoring the control bandwidth of the frequency regulation loop at peak phase margin for particular input or output voltages or different switching frequency settings.

It is another object of the invention to provide a hybrid PLL and pulse distribution structure for multi-phase variable frequency control operation which provides faster transient response, is less noise sensitive and maintains sufficient phase margins for high control bandwidth design of the output voltage feedback loop.

In order to accomplish these and other objects of the invention, a multi-phase power converter is provided including two single phase power converters connected in parallel between a source of input power and an output, wherein each of the single phase power converters includes a switch connected in series with an inductor between the source of input power and the output, a first comparator for comparing a voltage at the output with a reference voltage and providing a control voltage, a second comparator for comparing a signal representing ripple of voltage or current at the output and the control voltage, and an on-time generator responsive to an output of the second comparator to determine a duty cycle at which the switch is conductive, wherein the on-time generator includes a ramp signal generator for generating a ramp voltage waveform having a slope, wherein the multi-phase power converter further includes an adaptive phase-locked loop (PLL) arrangement including a phase-frequency detector wherein the adaptive phase-locked loop arrangement maintains substantially constant bandwidth over changes in the duty cycle and provides interleaving of on-time periods and pulse frequency modulated signal outputs of the two single phase power converter.

In accordance with another aspect of the invention, a method of stabilizing a phase-locked loop (PLL) controlled multi-phase power converter, the method comprising steps of developing a small signal model of a transfer function between an on-time generator of the multi-phase power converter and a signal having pulses of constant amplitude and a frequency representing a phase difference between an output of the on-time generator and a reference clock of the PLL, the transfer function having a pole to capture the phase difference a zero to boost phase margin at a frequency and a further pole to filter the pulses, and causing operation of at least one portion of the multi-phase power converter to operate in a manner to cancel $V_{in}$, Vo and $f_{clk}^2$ terms in the small signal model.

BRIEF DESCRIPTION OF THE DRAWINGS

The foregoing and other objects, aspects and advantages will be better understood from the following detailed description of a preferred embodiment of the invention with reference to the drawings, in which:

FIGS. 1A and 1B illustrate effects of external ramp signal slope and duty cycle using constant on-time (COT) control in pulse distribution structures, FIG. 1C illustrates phase margin of COT control using phase locked loop (PLL) structures.

FIGS. 32A, 32B and 32C illustrate results of a simulation of $T_2$, $Z_{oc}$ and a step-up load transient, FIG. 36 illustrates application of simplified hybrid interleaving to ramp pulse modulation (RPM) control, FIG. 37 illustrates application of simplified hybrid interleaving to hysteresis control.

DETAILED DESCRIPTION OF A PREFERRED EMBODIMENT OF THE INVENTION

Figure 2A:
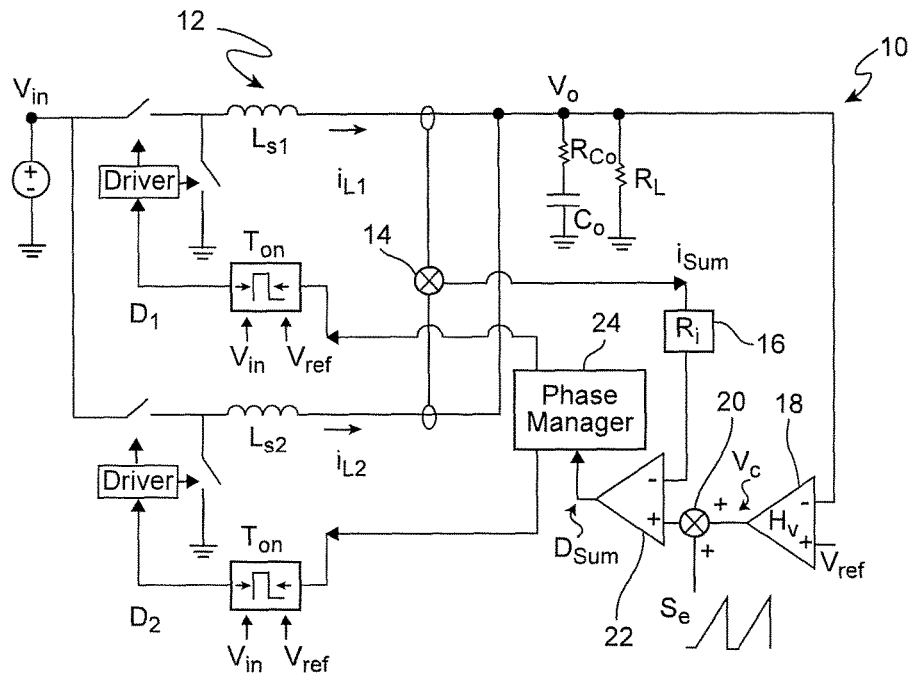
FIG. 2A is a simplified schematic diagram of a two-phase pulse distribution structure.

Referring now to the drawings, and more particularly to FIG. 2A, there is shown a simplified schematic diagram of a two-phase pulse distribution structure, alluded to above. Since this diagram is both simplified and generalized as well as being arranged to facilitate an understanding of a problem addressed by the invention, no portion of FIG. 2A is admitted to be prior art in regard to the present invention. In particular, the element labeled "Phase Manager" 24 is essentially a commutator for distributing sequential pulses to different outputs as will be described in connection with FIG. 2B and results in the problems discussed below in connection with FIGS. 3 and 4 and is thus often implemented in logic for which many logic circuit designs will be apparent to those skilled in the art while other phase managers having a more complex function as will be described below are considered to be part of the invention. Phase manager 24 is, therefore, depicted as a fully generalized single element. Therefore, FIGS. 2A-4 have been labeled as "Related Art".

As will be immediately recognized by those skilled in the art, the two-phase pulse distribution structure 10 illustrated in FIG. 2A includes two buck converters connected in parallel between a source of input power at voltage $V_{in}$ and an output capacitor comprising capacitance $C_o$ and an internal and inherent series resistance $R_{Co}$ that provides an output voltage Vo to load $R_L$. While buck converters are illustrated for simplicity and familiarity, any other converter topology can be used or provided to develop particular behaviors and properties in multi-phase power converters.

In a buck converter, closing of the so-called top switch connected to the input power causes the current through the inductor to increase linearly. Conversely, when the top switch is opened and the so-called bottom switch is closed to deliver freewheel current to the inductor, the current through the inductor decreases linearly. Thus, when the load increases, Vc is increased because $C_o$ deviates away from $V_{ref}$ during a step-up load transient. The abrupt $V_c$ increment causes the frequency of the power pulses corresponding to $D_{sum}$ to increase abruptly. However, since the power pulses are distributed serially in pulse distribution structures, they cannot overlap; limiting the rate of increase of current delivered.

Figure 2B:
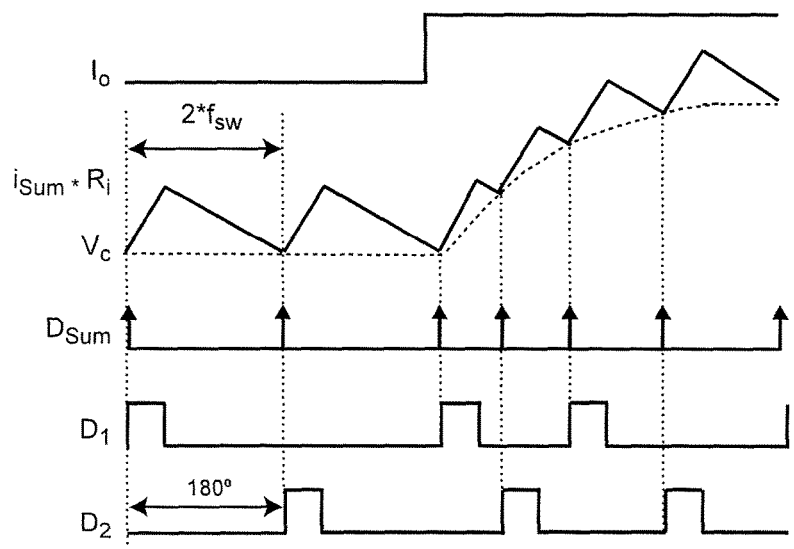
FIG. 2B is a graphic representation of the transient response of the pulse distribution structure of FIG. 1, FIGS. 3A and 3B illustrate the magnitude ratio of $i_{sum}$ to $i_{L1}$ and $i_{sum}$ in four-phase operation, respectively, which are useful for understanding ripple cancellation effect, FIGS. 4A and 4B respectively illustrate simulated closed loop output impedance ($Z_{oc}$) with an external ramp and waveforms when using an external ramp voltage with large slope to solve the ripple cancellation effect of $i_{sum}$.

An output voltage feedback loop provides regulation in which the output voltage Vo is sensed and compared with a reference voltage $V_{ref}$ at comparator/error amplifier 18 to determine when additional input power is required to be delivered through an inductor to the output filter and load to bring the output voltage to the desired value when the output voltage is drawn down by the load, as illustrated in FIG. 2B depicting a response to a load transient.

Specifically, it should be initially noted that during each PFM pulse, $i_{sum}$, the (sum of) inductor current increases linearly and, following the termination of a PFM pulse, decreases linearly, referred to as a freewheel current delivered by a switch connected to the current return path and operated in a complementary fashion to the switch connected to the power source. The $i_{sum}$ signal is multiplied by a transfer function, $R_i$, 16 and compared with a control voltage, $V_c$ (or the sum of $V_c$ and an external ramp signal having a slope, $S_e$, delivered from adder 20 as will be discussed below) at comparator 22 to determine the times/intervals, $D_{sum}$, (the symbol, D, indicating "duty cycle") when a PFM pulse should be delivered from the input power source to maintain voltage regulation when the signal $i_{sum}*R_i$ equals the control voltage, $V_c$. The $D_{sum}$ pulses are then distributed between or among the converter phases as pulse trains $D_1$ and $D_2$.

When the load is relatively light, the $D_{sum}$ pulses will be of relatively low frequency as illustrated at the left side of FIG. 2B. The pulses of preferably constant duration (determined by feedforward of the preferably constant input voltage $V_{in}$ with a reference voltage, $V_{ref}$) are generated in response to the distribution of the $D_{sum}$ pulses (which need not be the same duration—only the leading edge is sensed in the exemplary converter arrangement of FIG. 2A) and are generated alternately. When a transient due to an increased current draw by load, $R_L$, occurs, Vo is pulled down slightly and the output of comparator 18, $V_c$, (depicted by the dotted line in the uppermost waveforms of FIG. 2B) rises and the duration of freewheel current (before $i_{sum} \cdot R_i$ diminishes to equal $V_c$) becomes very short, increasing frequency of $D_{sum}$. Nevertheless, phase manager 20 does not allow pulses $D_1$ and $D_2$ to overlap and the return of Vo to the desired value, $V_{ref}$ is slow. As Vo stabilizes at the increased load current, the freewheel current duration increases and the frequency of $D_{sum}$ diminishes, but to a frequency substantially greater the frequency corresponding to a light load, as shown in FIG. 2B.

Since the PFM pulses are interleaved, the inductor current ripple of each phase is also interleaved at an appropriate angle at steady-state. The inductor currents of all phases are summed together and flow to the output capacitor and the load. The ripple magnitude of the total inductor current is therefore smaller than the ripple currents of the individual phases depending on the duty cycle because the interleaving cancels a portion or the entirety of the ripple of the individual phases. In FIG. 2A, sensed current magnitudes of both/all phases are summed at adder 14 to provide a signal corresponding to total delivered current, $i_{sum}$. When the number of commutated phases is increased, the ripple amplitude of the $i_{sum}$ signal can become very small, as compared in FIG. 3B between a single phase operating at a duty cycle of D=0.1 and a four-phase converter even operating at a larger duty cycle of D=0.24 and, in some cases, may be completely canceled. For example, if a four-phase converter were operating with each phase operating as D=0.25, one phase would connect $V_{in}$ to $V_o$ through a respective inductor in each phase at any given time and ripple occurring through any given phase (e.g. the ratio $i_{sum}/i_{Ln}$ which represents the ratio of ripple magnitude between the summed current and the ripple current of a given phase) would be canceled by another phase. That is, for certain values of duty cycle, D, when current from any given phase or plurality of phases falls, the current in another phase rises, canceling the ripple on which comparator 18 operates to provide regulation. Because of the interleaving of multi-phase operation, the magnitude of the ripple in the summation of inductor currents becomes smaller than the ripple in individual inductor currents and the ripple can cancel altogether for particular duty cycles and number of phases.

Figure 3A:
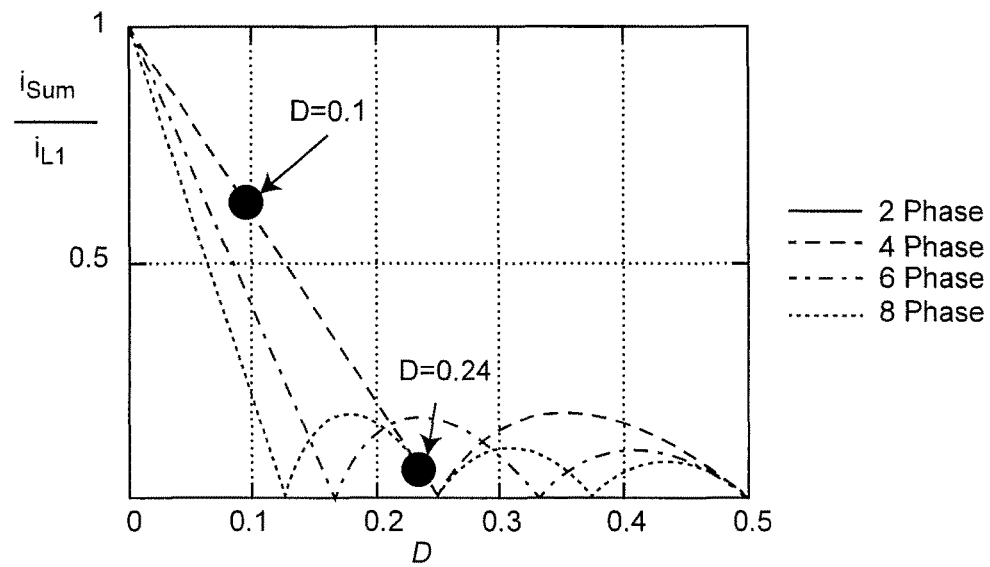
Figure 3B:
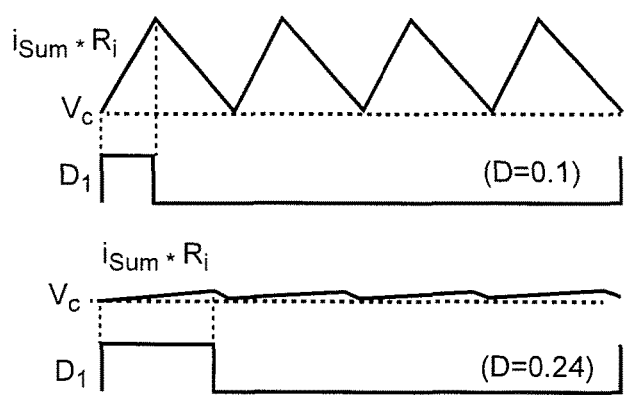

The relative degree of ripple cancellation over a range of duty cycle for two-phase, four-phase, six-phase and eight-phase converters is illustrated in FIG. 3A. Because of the interleaving of pulses in multi-phase converters, the magnitude of the ripple component of the summed currents from all phases becomes weaker with increasing duty cycle and number of phases. For example, consider a two-phase converter operating at D=0.4 where each phase is delivering 10 A DC current with a 5 A triangular current ripple. The sum of these currents is 20 A DC current but the ripple current is not 10 A (5 A+5 A) because the ripple resulting from the on-time generators are not in phase but 180° degrees out of phase and a portion of the diminishing freewheel current waveform of one phase will overlap with a portion of the increasing current waveform of the other phase. In this case, from FIG. 3A it can be determined that at D=0.4 for a two-phase converter, the ripple cancellation ratio between $i_{sum}$ and $i_L$ is 0.2 and the ripple in $i_{sum}$ is 1 A (0.2*5 A).

Figure 4A:
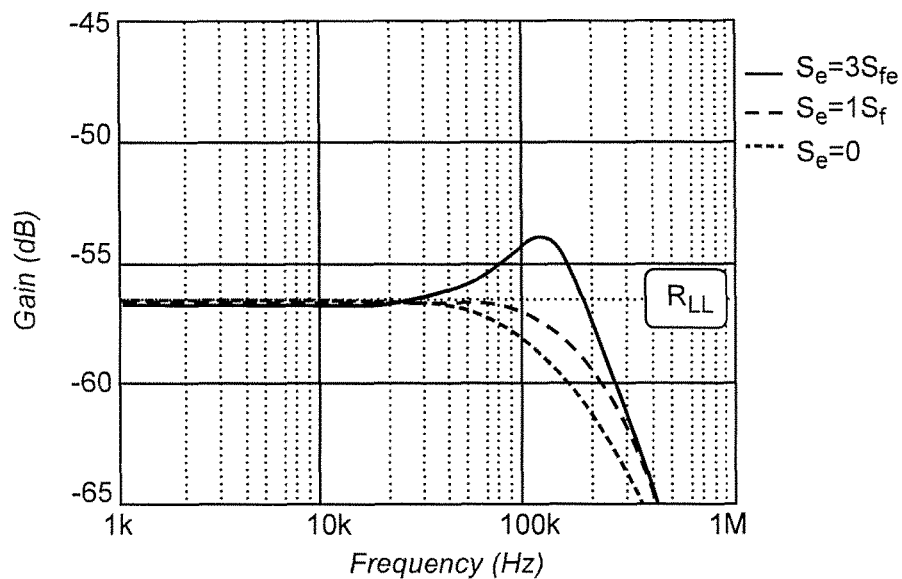
Figure 4B:
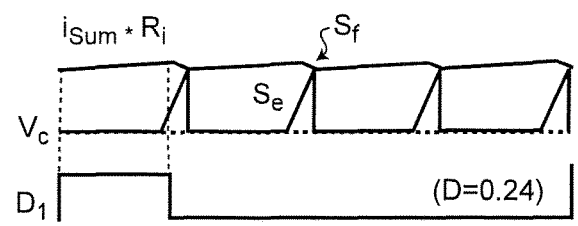

When ripple cancellation occurs or near ripple cancellation points, as illustrated in FIG. 3A, the converter becomes very sensitive to noise since the current feedback signal, $i_{sum}$, multiplied by a current feedback gain, $R_i$, can be easily overwhelmed by small voltage variations such as noise and cause duty cycle jittering (e.g. causing extra or omitted $D_{sum}$ pulses or phase/timing error). However, since the periods during which ripple cancellation can occur depend on the duty cycle and the ratio of total current, $i_{sum}$, to current from a given converter (e.g. $I_{L1}$) and the number of phases, as illustrated in FIG. 3A, duty cycle jitter can be largely avoided by addition of a ramp signal $S_e$ at adder 20 which is then compared with a signal corresponding to the sum of currents from all phases (e.g. $i_{sum}$ multiplied by Ri, 16) at comparator 22 to provide a signal having the required total duty cycle $D_{sum}$ in the form of pulses at the required frequency. These pulses are then distributed to the respective phases by phase manager or phase splitter 24 functioning essentially as a commutator to divide $D_{sum}$ pulses into pulse trains $D_1$ and $D_2$ as illustrated in FIG. 23. However, addition of such a ramp signal as illustrated in FIG. 4B causes impedance peaking as shown in FIG. 4A and transient response overshoot because the ramp signal can easily overwhelm the current ripple near the ripple cancellation point.

That is, since pulse distribution structures require an external ramp signal, $S_e$, the phase margin for stability is compromised. When the phase margin becomes less than 60°, the impedance peaking shown in FIG. 4A occurs. The strength of such peaking depends on the relationship between the slope magnitude of Se and $S_f$, the slope of the falling portion of the waveform of $i_{sum}$, because a larger slope of $S_e$ causes a lower phase margin in the loop gain of the output voltage feedback loop ($T_2$), as shown in FIG. 1A. Based on the control theorem, when the $T_2$ phase margin is less than 60°, peaking of the closed loop output impedance, $Z_{oc}$, occurs. Lower phase margin results in more severe peaking.

When $S_e$ is much smaller than $S_f$, the ramp does not overwhelm the current ripple even when the current ripple is relatively small and the delay effect is not significant. When $S_e$ is comparable to or greater than $S_f$, the delay effect dominates the pulse generation because the ramp becomes equal to or larger than the ripple component of $i_{sum}$. In other words, the $S_e$ design is a trade-off between stability and noise sensitivity.

As alluded to above, in the pulse distribution structure 10 illustrated, compensation for variation in input voltage is performed by using pulses from pulse manager 24 to trigger pulse frequency modulated (PFM) pulses where the pulse width is based on sensing the input voltage in comparison with the reference voltage to drive the so-called top switch of a respective buck converter to deliver a PFM pulse through the inductor to the output filter and load. The slow transient response to increased load current can be readily understood from the $i_{sum} \cdot R_i$ and Vc (e.g. control voltage) waveforms of FIG. 2B. Vc is a voltage that corresponds to the difference between Vo and the reference voltage as discussed above and controls the frequency of the PFM pulses, $D_1$ and $D_2$, delivered to the filter and load.

Figure 5:
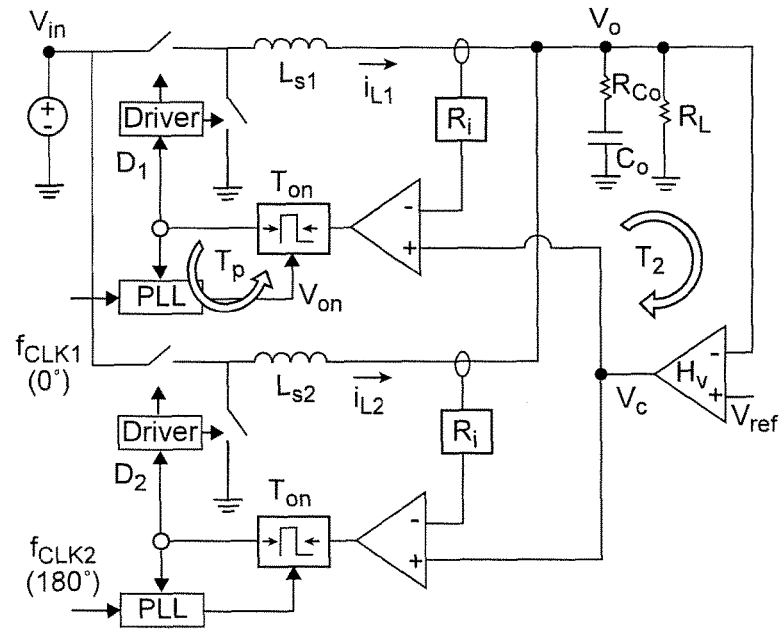
FIG. 5 is a simplified schematic diagram of a two-phase converter using PLLs, FIG. 6 graphically illustrate transient response of the converter of FIG. 5.

To overcome the above limitations of a pulse distribution structure, a phase locked loop (PLL) structure such as that schematically depicted in FIG. 5 is often used. Since FIG. 5 is also generalized and arranged to facilitate conveying an understanding and appreciation of the invention and FIGS. 6 and 11-13 illustrate behaviors of this arrangement and FIGS. 7-10 illustrate two generalized implementations of the phase locked loop structure of FIG. 5, no portion of any of FIGS. 5-13 is admitted to be prior art in regard to the present invention. Thus, FIGS. 5-13 are also labeled "Related Art".

In the two-phase structure illustrated in FIG. 5, a PLL and a fixed frequency clock is provided for each phase. It will also be noted from a comparison with the pulse distribution arrangement of FIG. 1, that a separate current sensor and control voltage $V_c$, comparator is provided for each phase such that PFM pulses are enabled independently for each phase. Interleaving of PFM pulses is achieved by synchronizing the PFM pulse generators with the respective phase locked loops, PLL, which are respectively synchronized to fixed frequency clock signals, $f_{clk1}$, $f_{clk2}$, which are separated in phase by 180° for two phases, as illustrated, or, more generally, 360°/N where N is the number of phases of the converter. Thus, the PFM pulses from the respective phases will be interleaved alternately or in sequence and equally spaced in time for constant load and the PFM pulses from respective phases may overlap if required by the magnitude of the load current or to respond to a load transient, as shown in FIG. 6.

However, use of PLLs that are synchronized to fixed frequency clocks also implies that the PFM pulses will occur at the same fixed frequency or multiples thereof. As alluded to above, constant on-time (COT) operation with PFM pulses initiated by the output voltage falling below the reference voltage requires the PFM pulse frequency to vary to provide voltage regulation and match the inductor current to the current provided to the load. To resolve these conflicting requirements while retaining the advantages of COT control, the response of the frequency regulation loop formed by the PLL and the on-time generator must be designed to be much slower than the response of the output voltage feedback loop. That is, the bandwidth of $T_p$ must be designed much lower than the bandwidth of $T_2$, as will now be described in connection with the improved transient response of the arrangement of FIG. 5.

Figure 6:
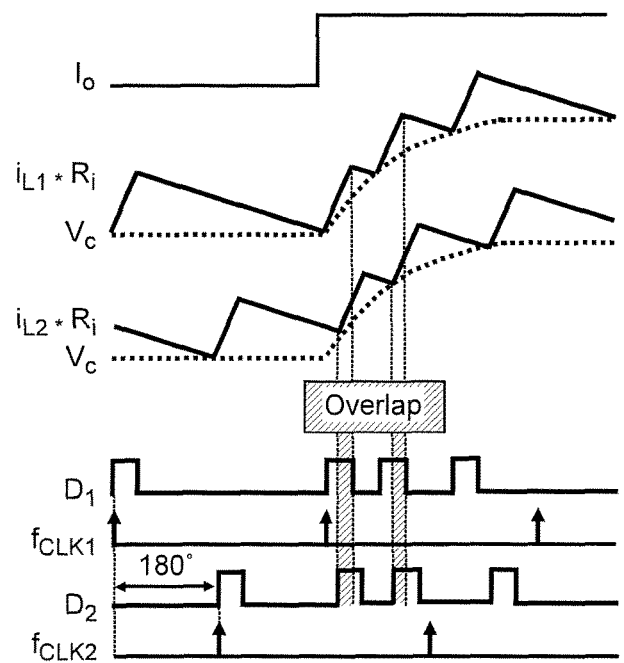

Referring now to FIG. 6, it is seen that for a constant light load, PFM pulses, $D_1$ and $D_2$ are initiated simultaneously with $f_{clk1}$ and $f_{clk2}$ signals, respectively, and have a fixed duration which can be arbitrarily set as will be discussed below and will, at constant load and steady state operation, coincide with the times that the $i_{L1} \cdot R_i$ and $i_{L2} \cdot R_i$ signals match the $V_c$ control signal developed from a comparison of Vo and $V_{ref}$ as discussed above. That is, the frequency regulation loop will have adjusted the on-time of the PFM pulse to achieve coincidence of the leading edge of the PFM pulses and the fixed frequency clocks as will be discussed in detail below. When an increased load transient occurs, Vo will be pulled below $V_{ref}$ and $V_c$ will rapidly increase and cause PFM pulses to be generated more frequently in each phase such that the PFM pulses in each phase can overlap naturally and increase the speed of the transient response, as alluded to above. During this period, the respective PLLs lose tracking with the PFM pulses but the PFM pulses are still significantly offset from each other due to the previous phase angle separation. When $V_c$ reaches a near-constant maximum, the PFM pulse frequency assumes a more nearly constant but increased value and some offset in phase will remain, as is evident from the waveforms at the right side of FIG. 6. It is important to appreciate that the higher frequency of the PFM pulses also inherently causes them to occur earlier than the respective fixed frequency clock pulses. The frequency regulation loop using a PLL in each phase is then used to adjust the on-time of the respective phases to reduce the PFM pulse frequency such that the respective PLLs can again achieve locking with the PFM pulse frequency and operation in an essentially COT manner may be resumed.

Figure 7:
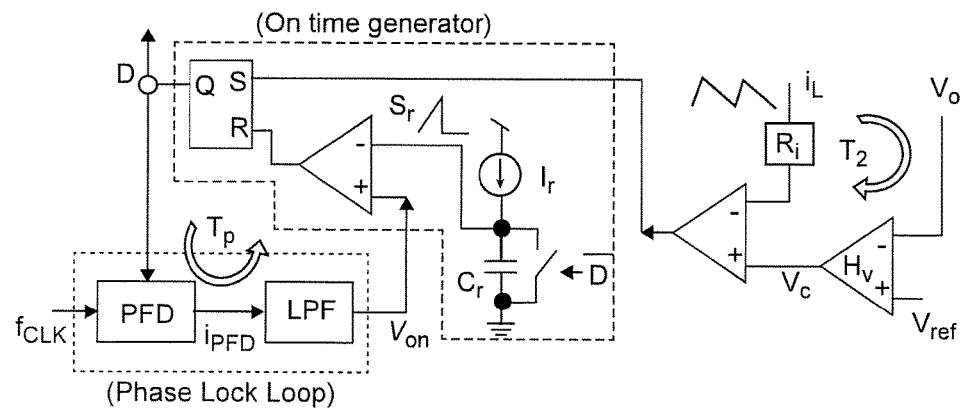
FIG. 7 is a simplified schematic diagram of a first known PLL implementation.
Figure 8:
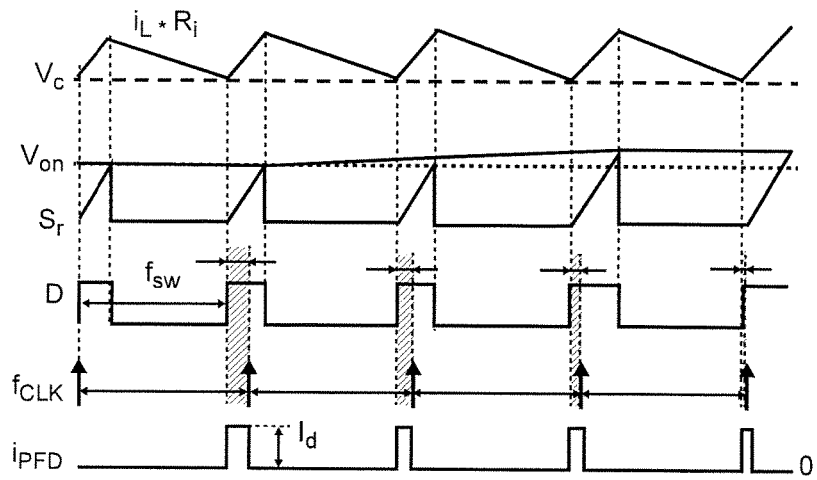
FIG. 8 illustrates operational waveforms of the PLL implementation of FIG. 7.
Figure 9:
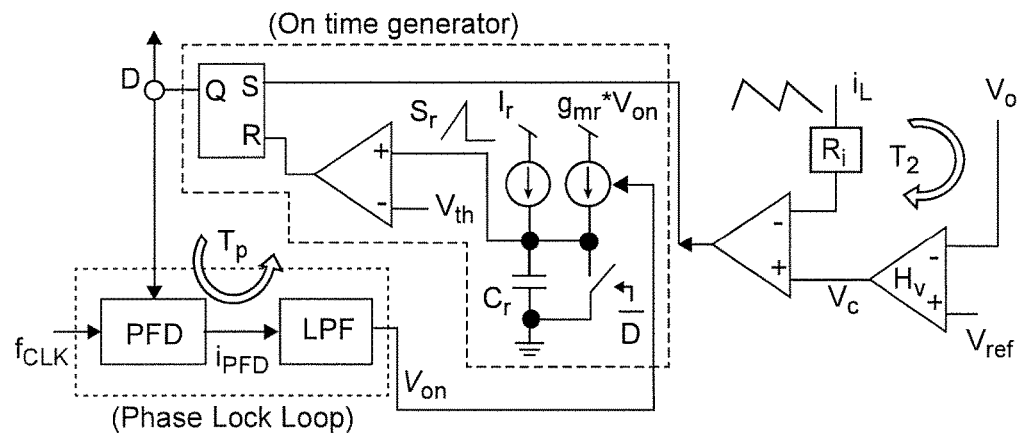
FIG. 9 is a simplified schematic diagram of a second known PLL implementation.
Figure 10:
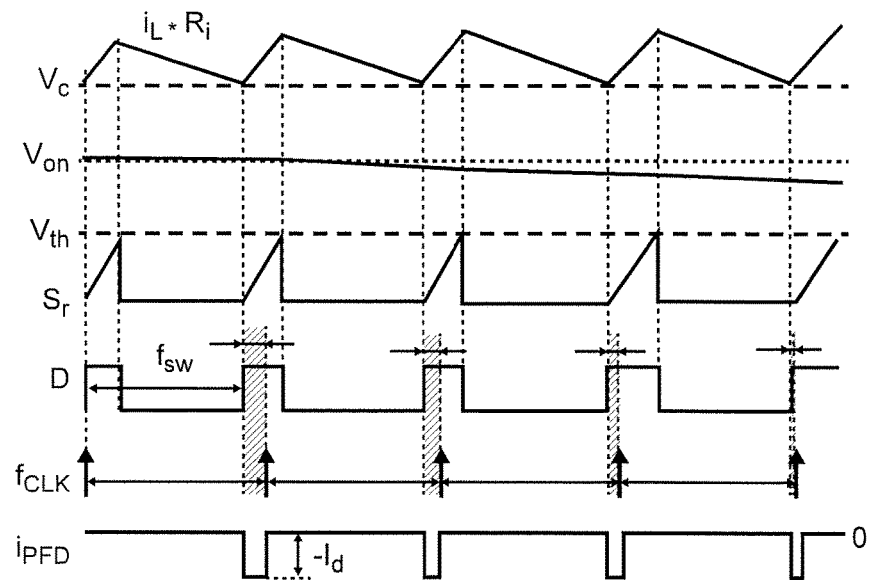
FIG. 10 illustrates operational waveforms of the PLL implementation of FIG. 9, FIG. 11 graphically illustrates $T_p$ bandwidth (BW) effects of PLL stability, FIG. 12 graphically illustrates $T_p$ bandwidth (BW) effects on impedance ($Z_{oc}$), FIG. 13 graphically illustrates effects of low $T_p$ bandwidth (BW) on speed of switching frequency change, FIGS. 14A, 143 and 14C respectively illustrate low pass filter (LPF) design, BW variation over duty cycle change and BW variation over clock frequency change, FIGS. 15A and 15B graphically illustrate anchoring of the adaptive PLL loop in accordance with the invention with auto-tuned loop bandwidth.

As mentioned above, two general types of PLL implementations in connection with on time pulse generators to achieve adaptive on time are known (but not admitted to be prior art) and are depicted in FIGS. 7 and 9, respectively. FIGS. 8 and 10 respectively illustrate waveforms to explain the operation of these types of PLL implementation. Both implementations employ a phase-frequency detector (PFD) to compare the relative phase (e.g. time of leading edge) of two pulse trains to determine the frequency difference of the pulse trains, as is well-understood in the art. PFD circuits basically provide a current pulse train in which the pulses have a fixed magnitude $I_d$ and a width which corresponds to the phase difference by which a pulse of one frequency lags behind a pulse of another frequency. Such a function can be achieved with a simple logic circuit that uses, for example, a leading edge of a pulse of one frequency to define the leading edge of a current pulse and a leading edge of a pulse of another frequency to define the trailing edge of the current pulse. The current pulse train thus generated can then be passed through a low pass filter (LPF) to smooth the pulse signal, $i_{PFD}$, to an incremental change in the $V_{on}$ control signal.

In the implementation illustrated in FIG. 7, the $V_{on}$ signal is compared with a fixed slope ramp signal generated by a series connection of a current source $I_r$ and a capacitor $C_r$. The capacitor $C_r$ is discharged and the ramp reset to zero volts during the off-time of the on time generator output. Thus, as shown in FIG. 8, since the leading edges of on-time/PFM pulses D is advanced relative to the fixed frequency clock of a respective phase, low pass filtering of $i_{PFD}$ causes an increase in $V_{on}$ and causes the on time of the PFM pulses to be increased over a plurality of pulses. The lengthening of the PFM pulses causes a reduction in the frequency of the PFM pulses controlled by feedback loop $T_2$ until PLL locking is achieved and $i_{PFD}$ pulse width becomes zero.

The implementation type illustrated in FIG. 9 operates in a somewhat similar manner but with a first difference that the $V_{on}$ signal controls a current source (separately depicted as $g_{mr}$ since it is preferably implemented as a current mirror or transconductance amplifier) that alters the charging rate of $C_r$ and the ramp slope $S_r$. The second difference is that the polarity of the PFD output is opposite to that of FIG. 7 since the on-time control is at the other side of the comparator to cause lengthening of the PFM pulses and consequent reduction in their frequency until phase lock and synchronization of PFM pulse frequency with the clock frequency is again achieved.

Figure 11:
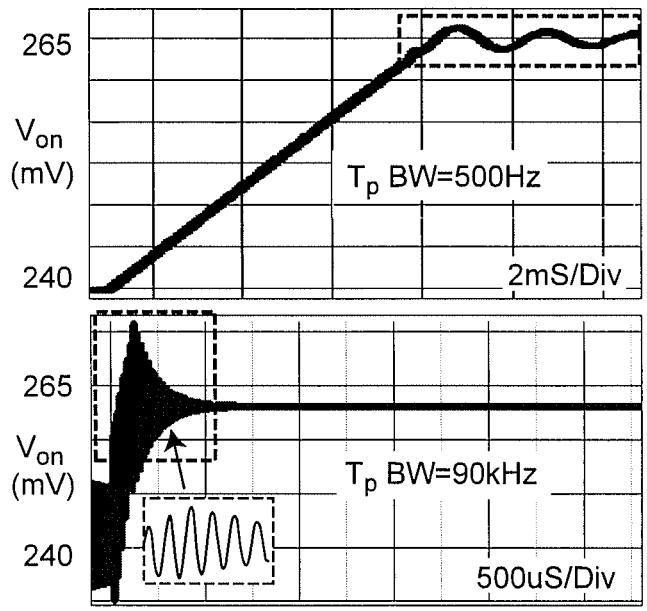
Figure 12:
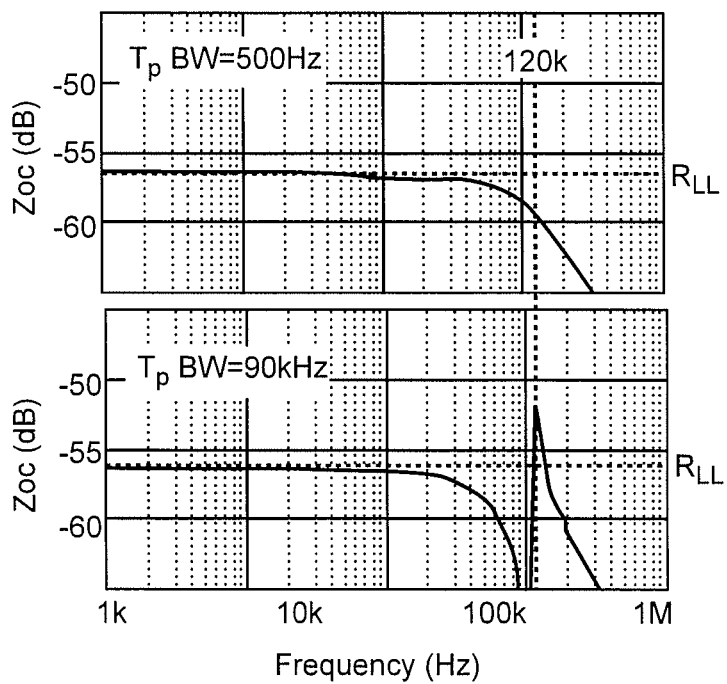
Figure 13:
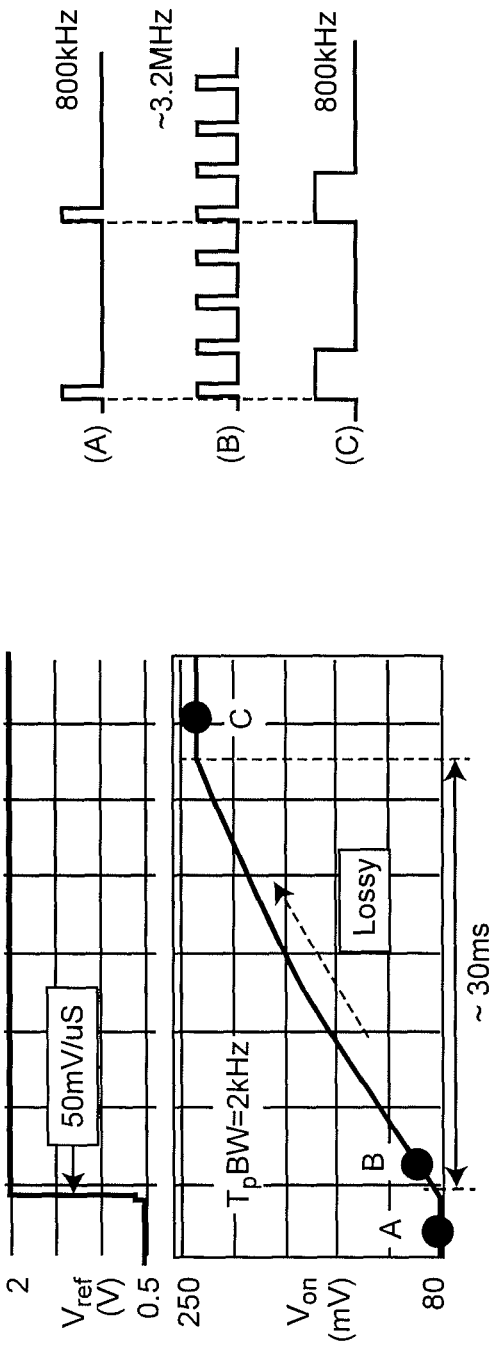

In this regard, the speed or rate of $V_{on}$ change depends on the bandwidth (BW) of the PLL loop gain ($T_P$). The bandwidth design of the frequency regulation loop $T_pBW$ can affect loop stability and system performance and thus complicates loop design. The simulated waveforms of FIG. 11 show that an unstable oscillatory response can occur for either very high (e.g. 90 KHz) or very low (e.g. 500 Hz) values of $T_pBW$. Additionally, $T_pBW$ design has a large impact on system performance since output impedance exhibits peaking as shown in FIG. 12 when $T_pBW$ is close to the BW of the output voltage feedback look $T_2BW$ (e.g. at 120 KHz) because of the conflict between the two loops. Moreover, additional power losses are caused by low $T_pBW$ when frequent changes occur in $V_{ref}$ when the settling time is extended because the switching frequency $f_{sw}$ is higher than the fixed clock rate until PLL locking is achieved with longer PFM pulses, as shown in FIG. 13. No design guidelines for achieving loop stability are known to have been published in the literature in regard to either of the types of PLL and the frequency regulation loop arrangements described above and the following modeling and analysis for each of the respective types of PLL implementation described above are considered to be included within the scope of the invention. For either type of implementation, the inventors have discovered that a PLL structure capable of automatically tuning the control bandwidth of the control loop $T_p$ under conditions of wide variation of $V_{in}$, Vo and $f_{clk}$ based on the small signal model of the PLL loop. That is, the adaptive PLL of the invention is to improve performance of the $T_p$ loop gain formed by the PLL and on-time generator. The bandwidth or crossover point of the $T_p$ loop can be anchored at the highest phase margin to make the PLL slow and stable. The hybrid interleaving not only simplifies the circuit implementation that achieves interleaving using an adaptive PLL in applications with higher numbers of phases but also improves performance of the $T_2$ loop gain which is formed by the output voltage regulation feedback loop. The bandwidth of the $T_2$ loop can thus be designed at higher frequency with sufficient phase margin to achieve rapid response in a stable manner.

Specifically, a simplified model of the $V_{on}$ to $i_{PFD}$ transfer function can be derived simply by describing its function as follows:

$$\frac{i_{PFD}(s)}{v_{on}(s)} \approx -\frac{I_d}{S_r} \cdot \frac{V_{in} f_{CLK}^2}{V_o} \cdot \frac{1}{s} \quad (1)$$

The LPF function can be derived by providing one original pole (1/s) at zero Hz to recover the phase error from $i_{PFD}$, one zero ($\omega_z$) to boost phase margin (PM) and one pole ($\omega_p$) to filter the pulsating $i_{PFD}$, as follows $$LPF(s) = \frac{A}{s} \frac{(s/\omega_Z + 1)}{(s/\omega_P + 1)} \quad (2)$$

The gain, $T_p$, is the product of these two expressions (1) and (2) and is given by:

$$T_P(s) = -\frac{i_{PFD}(s)}{v_{on}(s)} LPF(s) = \frac{I_d}{S_r} \cdot \frac{V_{in} f_{CLK}^2}{V_o} \frac{A(s/\omega_Z + 1)}{s^2(s/\omega_P + 1)} \quad (3)$$

Figures 14A, 14B, 14C:
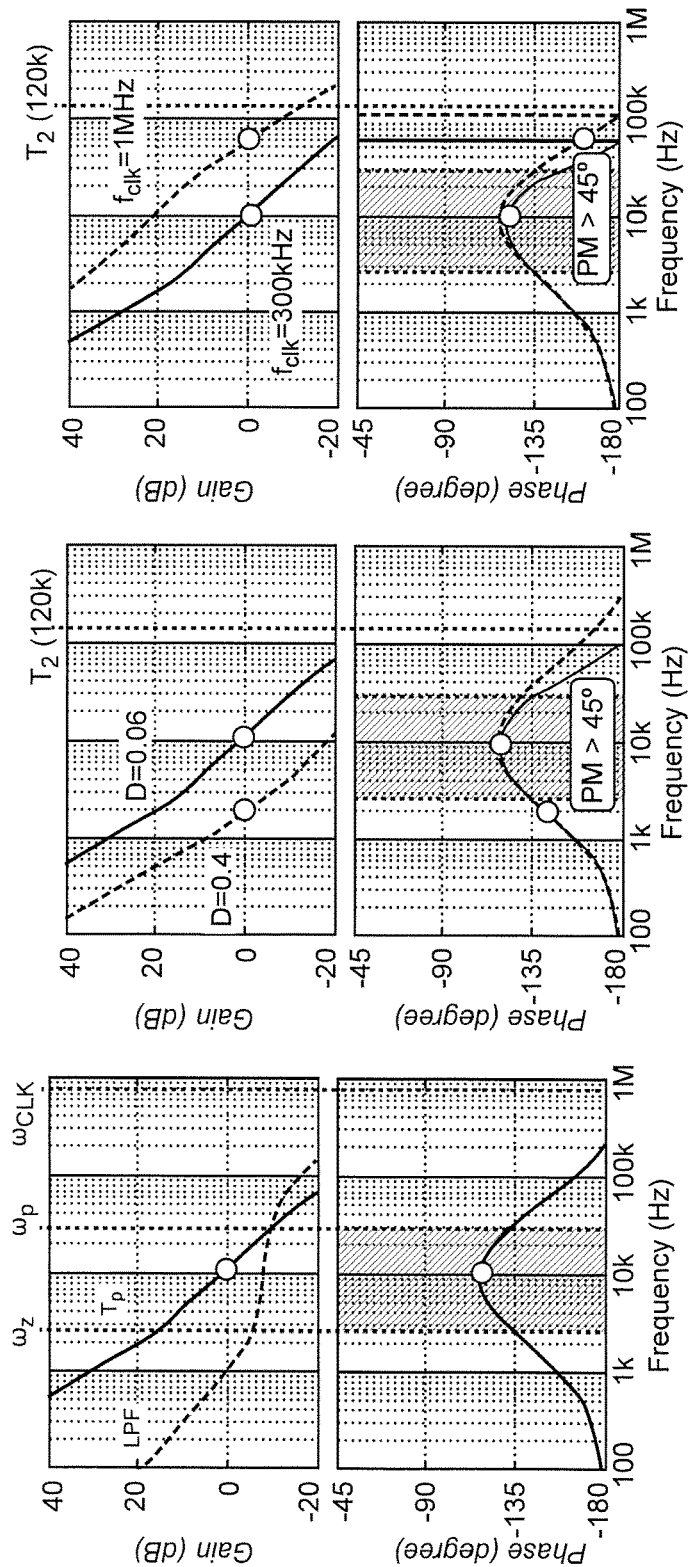
Figure 15A:
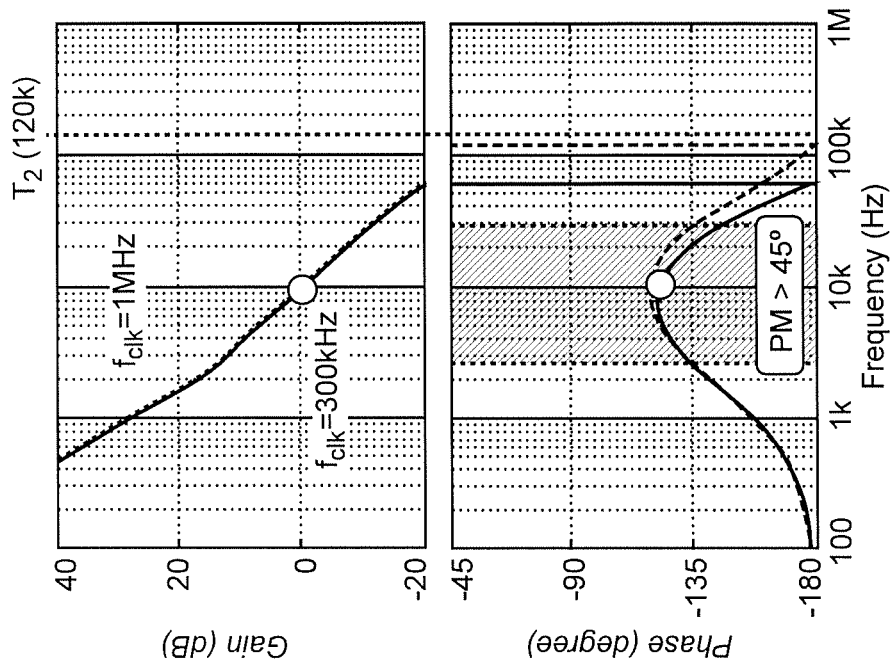
Figure 15B:
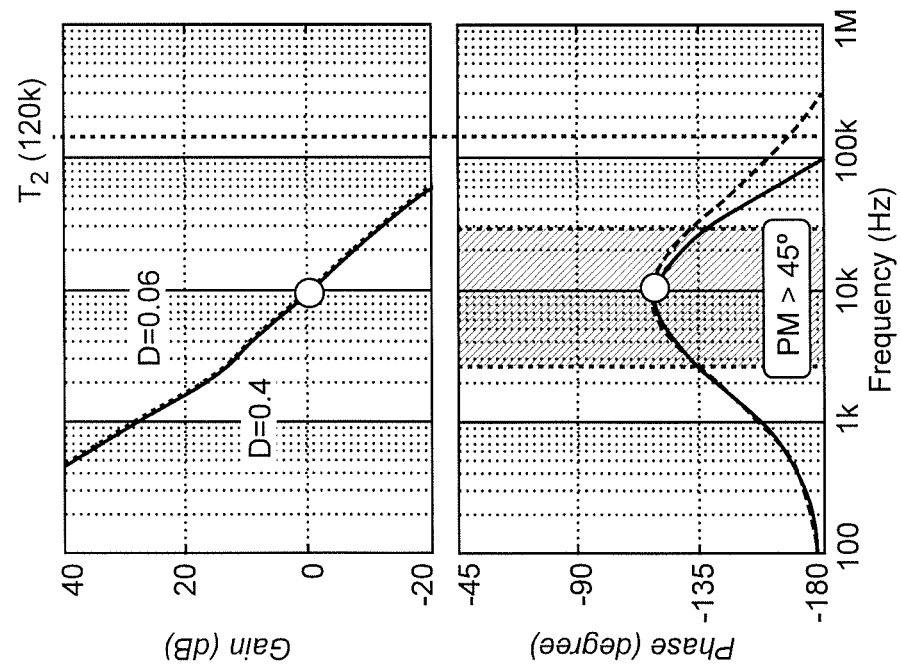

The Bode plot of $T_p$ given by expression (3) is shown in FIG. 14A and shows that the phase characteristic starts at −180° because of the two poles and, with increasing frequency, the phase margin becomes greater than 45° (e.g. −135°) when $\omega > \omega_z$ and then falls below 45° again when $\omega > \omega_p$. Thus, there is only a narrow frequency range where sufficient phase margin (greater than 45°) for stable operation; indicating a requirement for careful design of $T_p BW$ since insufficient phase margin causes the oscillatory response shown in FIG. 11, as discussed above.

This small signal model provided in expressions (1)-(3) also indicates that $T_p BW$ can vary with $V_{in}$, Vo and/or $f_{clk}$. For example, when the duty cycle (which is equal to the ratio of $V_{in}$/Vo), D=0.06, the BW crosses over 0 db at the $T_p BW$ of 10 kHz with highest phase margin, PM, but at D=0.4, the BW is shifted out of the stability region and the phase margin, PM, is less than 45°, as shown in FIG. 14B. Conversely, to explain the effect of changes in $f_{clk}$ (since converters may be designed for lower clock frequency to increase efficiency, other converters may be designed for higher frequency operation to increase power density) as shown in FIG. 14C, when $T_p BW$ for the case of $f_{clk}$=300 kHz is designed at 10 kHz corresponding to peak phase margin, the $T_p BW$ for the case of $f_{clk}$=1 MHz is shifted out of the stability zone. Further, as alluded to above, the $T_p BW$ at 60 kHz is pushed too close to the BW of loop $T_2$ at 120 kHz and causes high impedance peaking as shown in FIG. 12. Currently, no design strategy is known for determining an optimum or even a practical limit for BW that can unconditionally avoid instability. In summary, changes in $V_{in}$, Vo and $f_{clk}$ are parameter changes that may be dictated by design considerations and the PLL is very sensitive to such parameter variations and cause issues of instability. Therefore, it can be easily seen that BW variation of the PLL of FIGS. 7 and 9 make LPF compensation very difficult.

In order to overcome such difficulties and problems, the invention provides an adaptive PLL to maintain a constant bandwidth over wide variations of $V_{in}$, Vo and $f_{clk}$ so that the BW can automatically be anchored at the location of the peak phase margin. Accordingly, sufficient phase margin is guaranteed in order to provide unconditional stability of operation and good efficiency. Additionally, PLL compensation becomes very simple.

Specifically, in accordance with the small signal model of expression (3), above, three variables, PFD pulse amplitude ($I_D$), gain of LPF (A) and the slope of the ramp generator ($S_r$) in the on time generator in the implementation of FIG. 7 can be used to cancel $V_{in}$, Vo and $f_{clk}$ terms in expression (3). Numerous suitable implementations for achieving such cancellations will be evident to those skilled in the art from the following two exemplary implementations.

Figure 16:
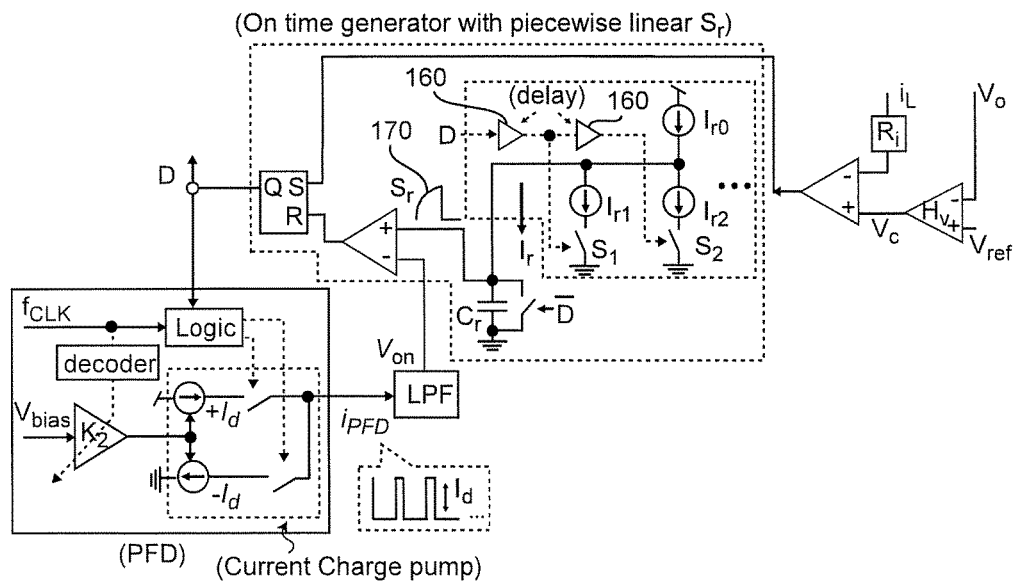
FIG. 16 is a schematic diagram of an exemplary first implementation of an adaptive PLL for constant on-time (COT) control in accordance with the invention, FIG. 17 graphically illustrates the principle of the piecewise linear ramp in the on-time generator of FIG. 16
Figure 17:
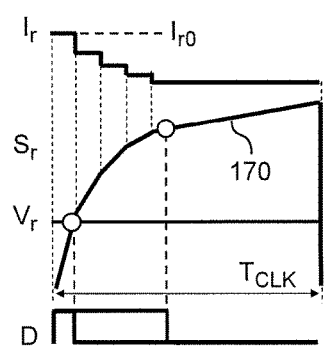

In the first exemplary implementation, schematically illustrated in FIG. 16, a piecewise linear ramp of slope $S_r$ is used to cancel the ratio of $V_{in}$ and Vo and an adjustable amplitude $I_d$ of the pulsating current $i_{PFD}$ is used to cancel the $f_{clk}^2$ term. Since D=$V_{in}$/Vo for a buck converter, the slope $S_r$ can be designed to be inversely proportional to D. This alteration of ramp slope can be achieved, for example, by a switched current mirror bank ($I_{r0}$, $I_{r1}$, $I_{r2}$ ...) with delays (e.g. developed by a tapped delay line) between shunting current to ground to charge $C_r$ at different respective rates corresponding to the inverse of changes in duty cycle D or on time duration of the PFM pulse. That is, when the PFM pulse signal pulls high, total charging current and ramp ($V_r$) slope reduces gradually as shown in FIG. 17. The piecewise linear ramp function/curve is curve-fitted in accordance with $$V_{Sr}(t) = K_1 \int_{t=0}^{t} \frac{f_{CLK}}{t} dt = K_1 f_{CLK} \ln(t) \quad (4)$$

$$S_r = \frac{I_r}{C_r} = \frac{I_{r0}\left(1 - \sum_{i=1}^{m} N_i S_i\right)}{C_r} \quad (5)$$

to meet $S_r = K_1/D$. Such curve-fitting can be accomplished by designing the transfer ratio ($N_i$) and the number (m) of the current mirrors sequentially connected during period D through application of delays 160 and the sequence $S_i$ in which they are switched on. The slope is reduced as the number of connected current mirrors increases. The total number of current mirrors provided determines the resolution of the curve fitting for the piecewise linear ramp 170. Further, as illustrated in FIG. 16, the PFD preferably provides paired current sources providing current of magnitude $I_d$ but opposite polarity. The current magnitude, $I_d$, is preferably controlled by a bias voltage through a current mirror with gain of $K_2$. The polarity is preferably controlled by a logic circuit based on the frequency and phase difference between $f_{clk}$ and the PFM signal. In order to cancel the $f_{clk}^2$ term, the current magnitude of the two sources can be designed to be inversely proportional thereto by alteration of $K_2$ which can be programmed by a digital decoder based on the selection of $f_{clk}$. For example, if $K_2$=1 at $f_{clk}$ at 300 KHz, it would be programmed to reduce to ⅑ at $f_{clk}$=900 KHz (⅓² at 3×300 KHz).

Figure 18:
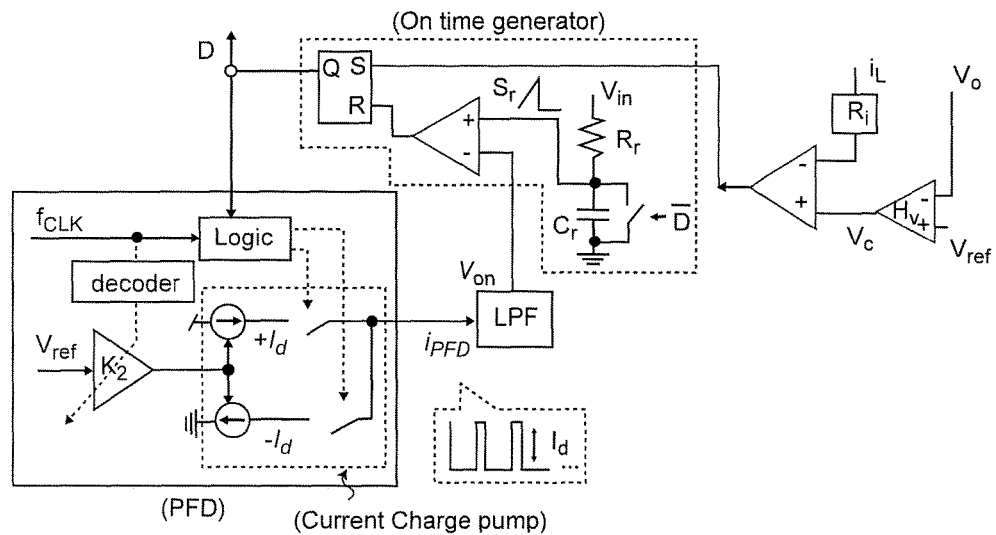
FIG. 18 is a schematic diagram of an exemplary second implementation of an adaptive PLL for constant on-time (COT) control in accordance with the invention.

In the second exemplary implementation illustrated in FIG. 18, the ratio of an adjustable $I_d$ and a linear ramp of slope $S_r$ is used to cancel the ratio of $V_{in}$ and Vo while $K_2$ of the PFD current charge pump is used to cancel the $f_{clk}^2$ term. Specifically, $S_r$ is generated by an $R_r C_r$ network connected to $V_{in}$ to make $S_r$ proportional to $V_{in}$ or an adjustable current source $I_r$ providing current proportional to $V_{in}$. In this case, the bias voltage of the paired current sources in the PFD are preferably connected to the reference voltage such that $I_d$ is proportional to Vo. To cancel the $f_{clk}^2$ term, $K_2$ is preferably programmed by a digital decoder based on the $f_{clk}$ selection in the manner described above for the first adaptive PLL and frequency regulation loop arrangement illustrated in FIG. 7.

The analysis and design methodology for the second adaptive PLL and frequency regulation loop arrangement illustrated in FIG. 9 is somewhat similar to that discussed above in connection with FIG. 7. Two further exemplary implementations (referred to as third and fourth implementations) will again be provided from which other implementations will be apparent to those skilled in the art. The simplified model of the $V_{on}$-to-$i_{PFD}$ transfer function is again derived based on a description of the required function as;

$$\frac{i_{PFD}(s)}{v_{on}(s)} \approx -\frac{I_d V_{th} g_{mr}}{S_r^2 C_r} \cdot \frac{V_{in} f_{CLK}^2}{V_o} \cdot \frac{1}{s} \qquad (6)$$

Compared with expression (1), above, the only significant difference is a different gain factor. The issue of BW variation caused by variations in $V_{in}$, Vo and $f_{clk}$ is precisely the same.

Figure 19:
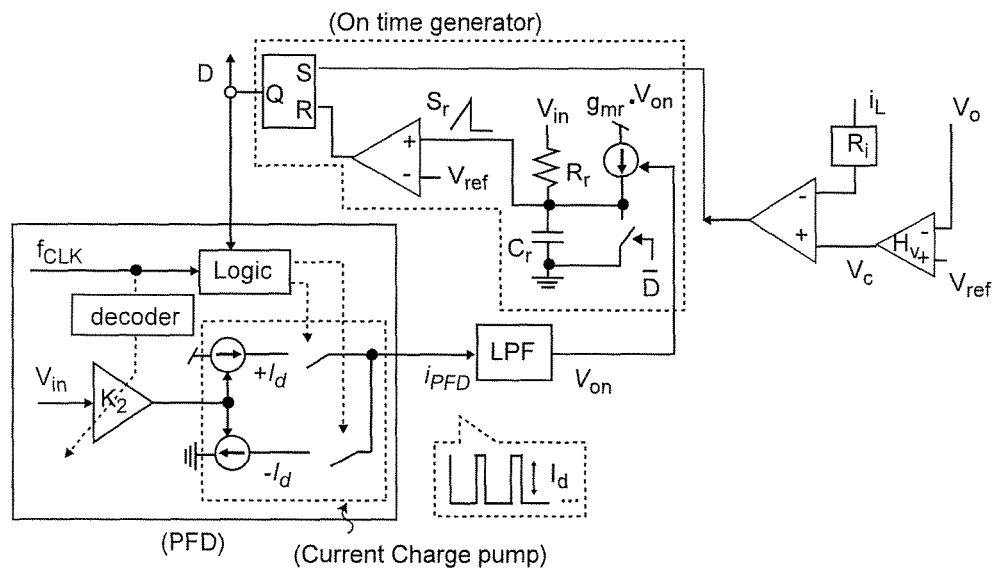
FIG. 19 is a schematic diagram of an exemplary third implementation of an adaptive PLL for constant on-time (COT) control in accordance with the invention.

The proposed model in expression (6) shows that there are five variables that can be used to cancel $V_{in}$, Vo and $f_{clk}$ terms: $i_{PFD}$ pulse amplitude, $I_d$; the threshold value of the $S_r$ peak value, $V_{th}$; transconductance amplifier gain, $g_{mr}$; the slope of the ramp on time generator, $S_r$; and the gain of the LPF, A. In the third implementation, illustrated in FIG. 19, the ratio of $I_d*V_{th}$ and $S_r^2$ is used to cancel the ratio of $V_{in}$ and Vo in expression (6) while an adjustable pulsating current of amplitude $I_d$ is used to cancel the $f_{clk}^2$ term. In the converter schematically illustrated in FIG. 19, $S_r$ is generated by an $R_rC_r$ network connected to $V_{in}$ such that the slope is proportional to the input voltage. $S_r$ could also be generated by an adjustable current source $I_r$ having a magnitude proportional to $V_{in}$. The bias voltage of the paired current sources, $+I_d$ and $-I_d$, in the PFD is connected to $V_{in}$ through a variable gain amplifier such that $I_d$ is also proportional to $V_{in}$. The $V_{th}$ comparator input of FIG. 9 is connected to the reference output voltage $V_{ref}$ to complete cancellation of the $V_{in}$/Vo ratio. The $f_{clk}^2$ term in expression (6) is canceled by altering gain $K_2$ as programmed in, for example, a digital decoder based on $f_{clk}$ selection of the controller design.

Figure 20:
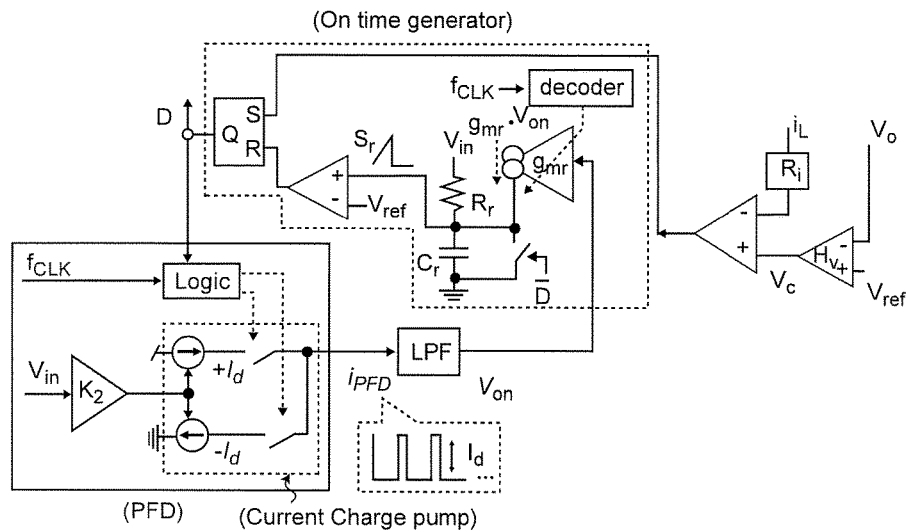
FIG. 20 is a schematic diagram of an exemplary fourth implementation of an adaptive PLL for constant on-time (COT) control in accordance with the invention, FIGS. 21A and 21B graphically illustrate an experimentally determined step-wise linear ramp and gain bandwidth over a wide duty cycle range of the first embodiment of the invention, respectively, FIGS. 22A and 22B graphically illustrate an experimentally determined gain bandwidth and transient response of the PLL of the second embodiment of the invention, respectively.

In the fourth implementation, illustrated in FIG. 20, the ratio of $I_d*V_{th}$ and $S_r^2$ is used to cancel the ratio of $V_{in}$ and Vo in expression (6), as in the third implementation, while a variable gain transconductance amplifier of $g_{mr}$ is used to cancel the $f_{clk}^2$ term in expression (6). The methods to adjust $S_r$, $I_d$ and $V_{th}$ terms are the same as in the third implementation described above but, to cancel the $f_{clk}^2$ term $g_{mr}$ is altered by programming of a digital decoder based on $F_{clk}$ selection of the controller design.

Figure 21A:
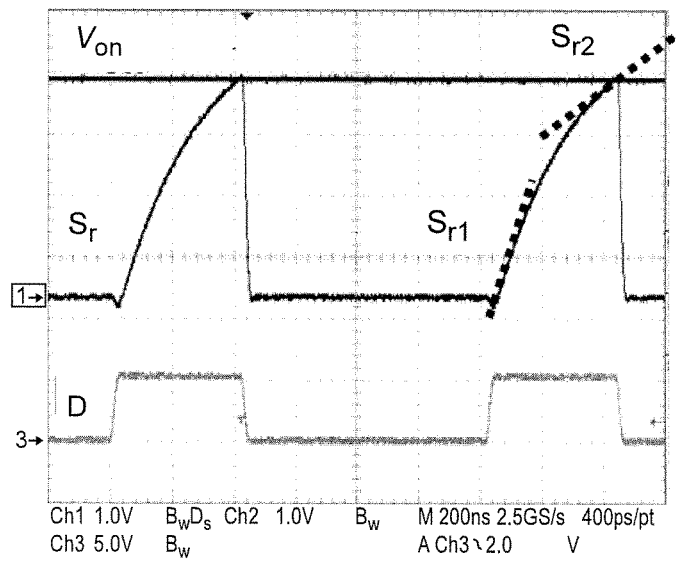
Figure 21B:
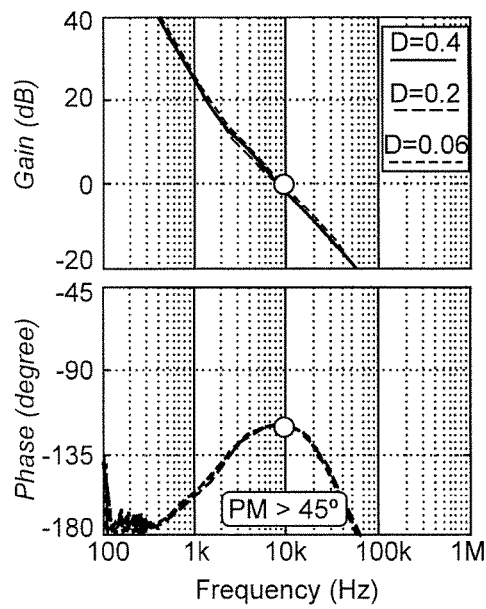
Figure 22A:
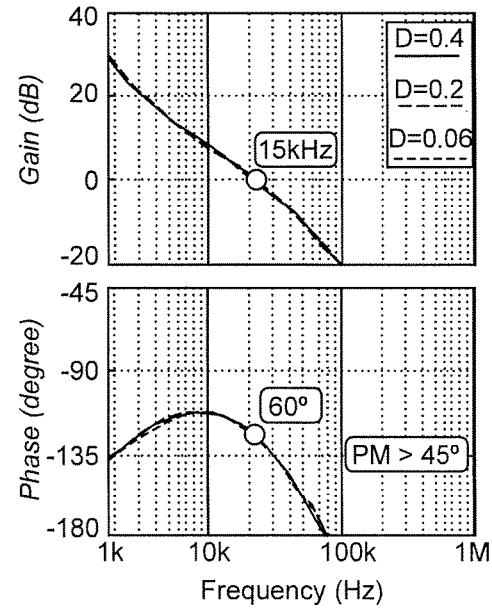
Figure 22B:
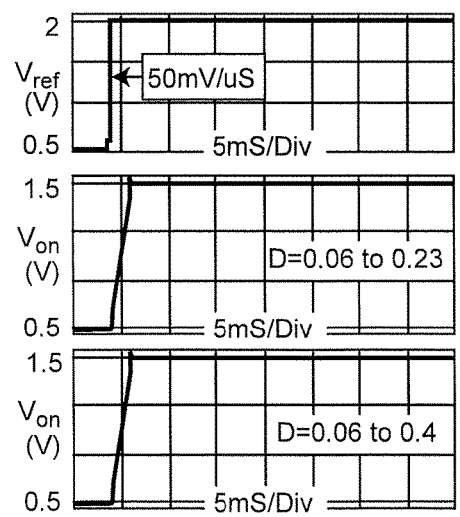
Figure 23A:
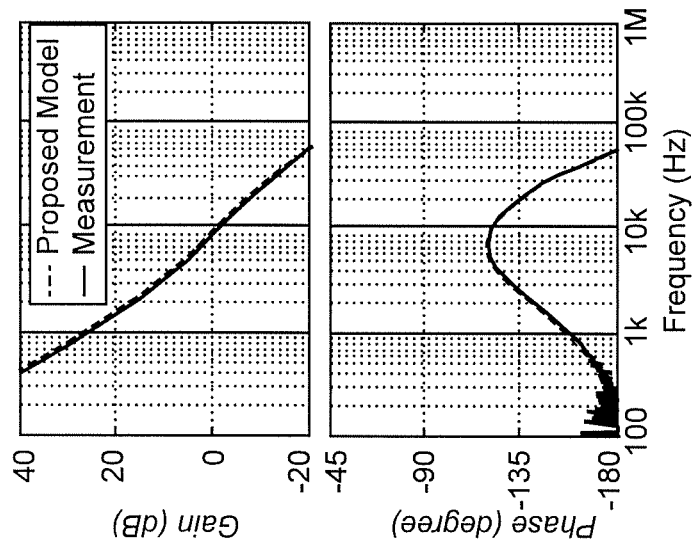
FIGS. 23A and 23B present a comparison of simulation and experiment for verification of the stability modeling in accordance with the invention, FIGS. 24A and 24B schematically illustrate two exemplary PLL implementations for RPM control.
Figure 23B:
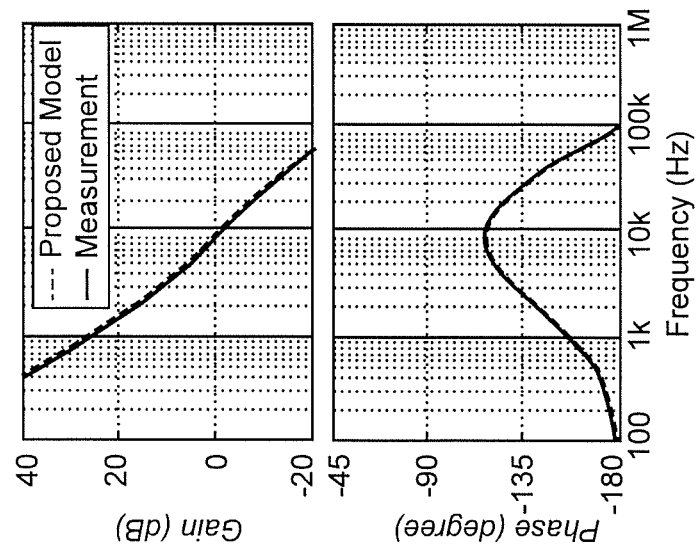

The efficacy of the above-described first and second implementations to automatically anchor the BW at the point of maximum phase margin to unconditionally avoid instability and quickly settle to locked synchronization with the fixed frequency clocks has been verified either experimentally or by simulation. The first adaptive PLL implementation was verified by experiment with the results shown in FIGS. 21A and 21B. FIG. 21A shows that the piecewise linear ramp exhibits different slope for long and short duty cycle operation and that $T_p$ loop gain change can be corrected or compensated. FIG. 21B show that the BW is automatically anchored at 9 KHz with a peak phase margin for stability of 60° over a wide duty cycle (D) range. Results of simulation of the second implementation is shown in FIGS. 22A and 22B. FIG. 22A shows that $T_p$BW remains substantially constant over a wide duty cycle range ($V_{in}$=5.2-8.4 volts, Vo=0.5-2.0 volts), indicating that it is possible to push $T_p$ to a higher value for faster PLL response. When fast output scaling (0.5 to 2.0 volts with a slew rate of 50 mV/μS) causes abrupt $f_{sw}$ changes and loss of PLL lock, FIG. 22B demonstrates that the PLL design can settle to steady state very quickly. FIGS. 23A and 23B demonstrate that the above small signal model on which the above analysis and automatic anchoring of the BW at the point of maximum phase margin is valid since the simulation and experimental results match extremely well. Therefore, the small signal model is considered to be valid for the third and fourth implementations described above and, moreover, can be used as a guide to develop other PLL designs.

Figure 24A:
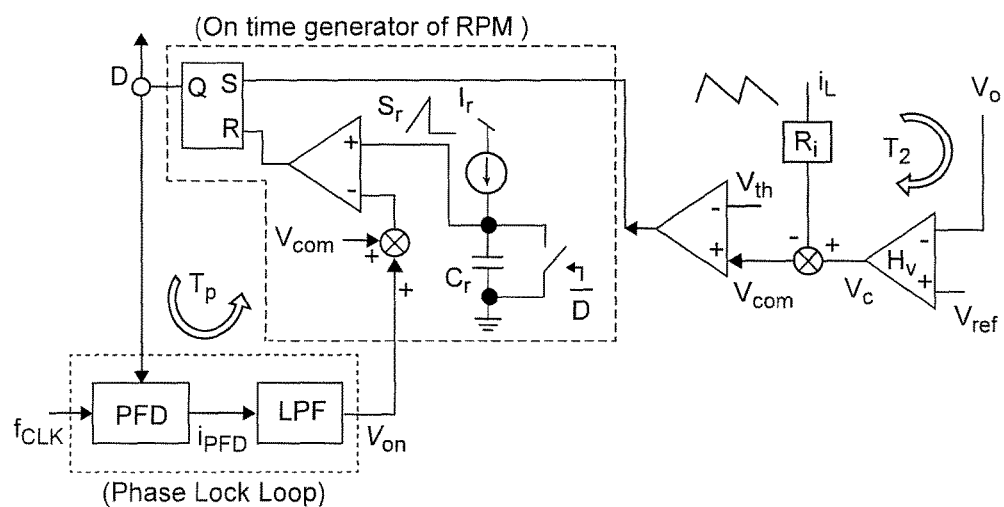
Figure 24B:
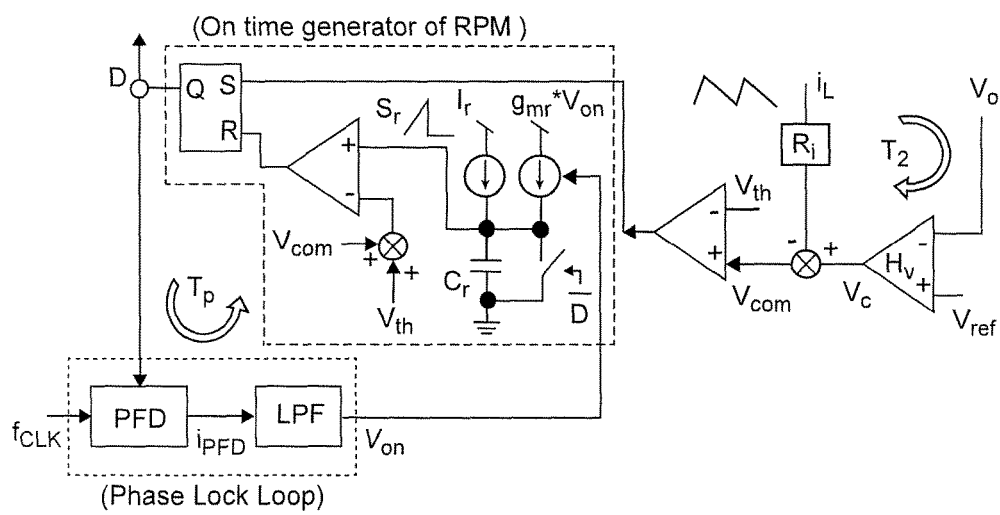

The PLL loop designs in accordance with the invention can be applied to ramp pulse modulation (RPM) control alluded to above because the operational principle of RPM control is similar to COT control. The major difference is that RPM control injects an additional $V_{COM}$ signal the voltage difference between $V_c$ and the inductor current feedback, $i_L*R_i$, into the on time generator. By doing so, the $V_{COM}$ change superimposed on the $V_c$ change during a step-up load transient can extend $T_{on}$ immediately to provide transient response that is even faster than COT control. No PLL implementation is currently known to exist in the relevant literature. Based on COT control with a frequency regulation loop as shown in FIG. 7 or 9, respectively, extensions of an adaptive PLL to RPM control are illustrated in FIGS. 24A and 24B. An extension of the adaptive PLL to RPM control for the fourth implementation described above is illustrated in FIG. 25.

Figure 25:
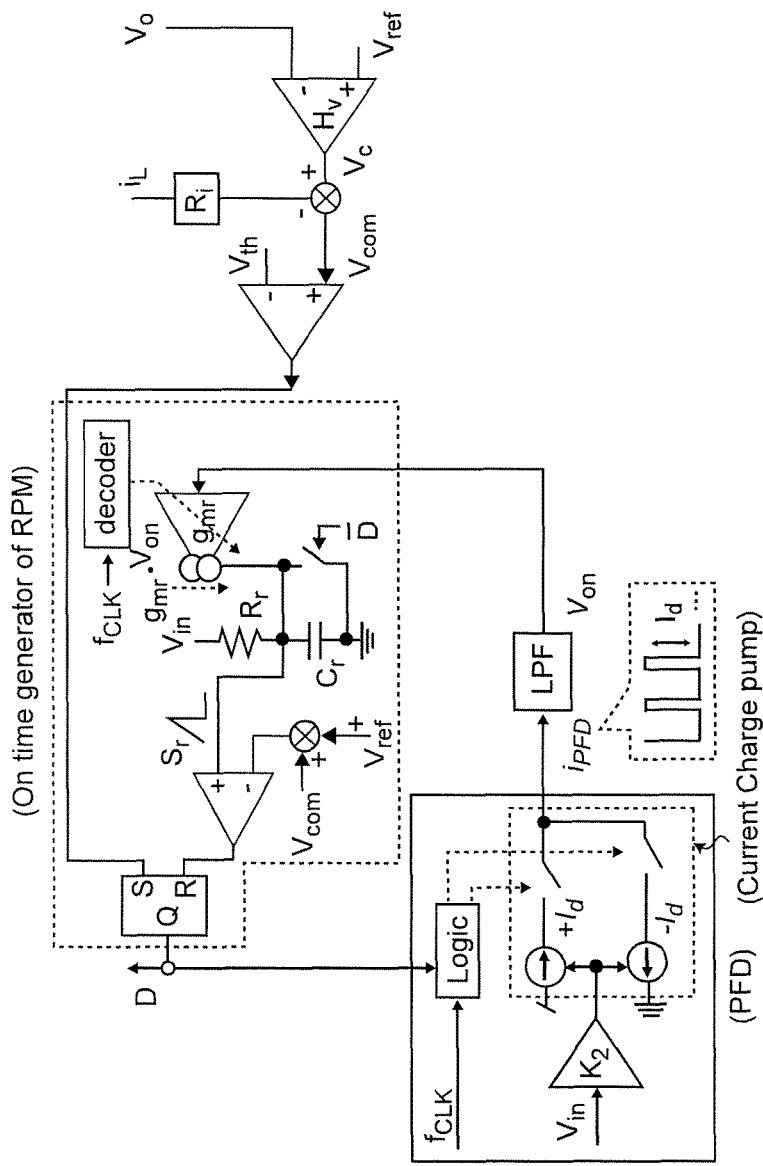
FIG. 25 is a schematic illustration of an example of the fourth adaptive PLL implementation extended to RPM control, FIG. 26 schematically depicts four-phase hybrid interleaving, FIG. 27 schematically depicts a simplified arrangement for four-phase hybrid interleaving, FIG. 28 schematically illustrates eight-phase hybrid interleaving, FIG. 29 schematically illustrates a simplified arrangement for eight-phase hybrid interleaving.

More specifically, two simplified loop models are given by $$\frac{i_{PFD}(s)}{v_{on}(s)} \approx -\frac{I_d}{(S_r+S_n)} \cdot \frac{V_{in} f_{CLK}^2}{V_o} \cdot \frac{1}{s} \qquad (7)$$

$$\frac{i_{PFD}(s)}{v_{on}(s)} \approx -\frac{I_d V_{th} g_{mr}}{(S_r+S_n)^2 C_r} \cdot \frac{V_{in} f_{CLK}^2}{V_o} \cdot \frac{1}{s} \qquad (8)$$

for the two PLL implementations of RPM control, respectively. By comparing equation (7) with equation (1) or equation (8) with equation (6), it is seen that the only difference in the loop models the rising slope, $S_n$=($V_{in}$-Vo)$R_i/L_s$, of the inductor current is added to the ramp slope $S_r$. When $S_r$ is designed to be larger than $S_n$, equations (7) and (8) can be approximated by equations (1) and (6), respectively, and the adaptive PLL implementation for RPM control may be approximated by the PLL implementation for COT control. Thus, for example the fourth adaptive PLL implementation as extended to RPM control as illustrated in FIG. 25 is the same as the adaptive PLL implementation for COT control illustrated in FIG. 20. Similarly, the other three adaptive PLL implementations discussed above can also be extended to RPM control in the same manner as for COT control.

While a valid technique for automatically anchoring BW to avoid instability of PLL loops in multi-phase COT controlled power converter and a solution to the problem of complexity of the adaptive PLL design have been fully described and the efficacy thereof demonstrated above in regard to a two-phase converter, there are applications for power converters in which more than two phases are desirable (e.g. to allow a smaller duty cycle range required for the anticipated variation in current draw of a load) in which interleaving of phases presents additional problems. While the complexity of a two-phase converter is not particularly onerous, the complexity increases dramatically as additional phases are added. It was demonstrated, above, that, although a pulse distribution structure using a phase manager provides substantial simplification in a two-phase converter implementation, slow transient response, noise sensitivity, ripple cancellation and limited bandwidth of the output voltage feedback loop are characteristic problems; some of which become particularly severe with increased numbers of phases as alluded to above in connection with FIG. 3B where four phases present substantial ripple cancellation and noise susceptibility. Accordingly, a perfecting feature of the invention provides a strategy in which a phase manager can be used to reduce complexity while an adaptive PLL avoids the characteristic problems associated with use of a phase manager. The concept of this strategy is to combine a phase manager with adaptive PLLs to construct a variable frequency control and properly choosing the number of phases and the particular phases which share a phase manager such that no ripple cancellation points can occur in the range of duty cycle of interest in the design.

Figure 26:
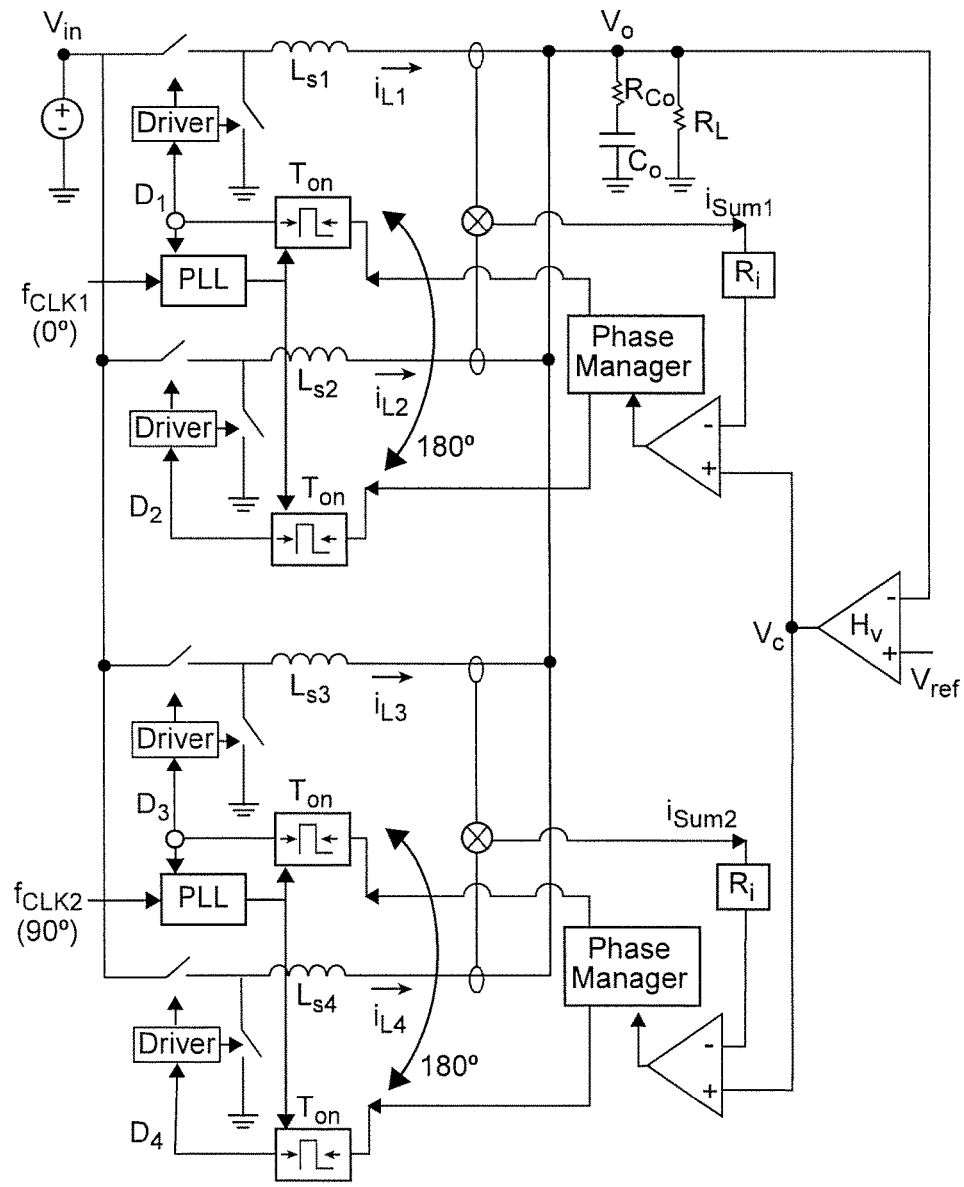

A hybrid interleaving structure for a wide duty cycle range is schematically illustrated in FIG. 26. For an application such as a laptop computer requiring a duty cycle range of 0.06 to 0.4, as described above, the magnitude of the ratio of $i_{sum}$ to $i_L$ of FIG. 3A shows that there is no ripple cancellation point within such a duty cycle range for a two-phase converter but one ripple cancellation point for a four phase converter. Therefore a phase manager type of pulse distribution structure can be applied for pairs of phases such that the phase angles between the first and second phases and the third and fourth phases, respectively, are shifted by 180°. In such a configuration, two PLLs can be used where one PLL forces the first phase to follow $f_{clk1}$ by adjusting the $T_{cm}$ of the first and second phases together. In a complementary fashion another PLL forces the third phase to follow $f_{clk2}$ which is 90° phase shifted from $f_{clk1}$ and adjusting $T_{on}$ of the third and fourth phases together. Compared with adaptive PLL arrangements with four phases, such a hybrid interleaving arrangement is far simpler by avoidance of a need for two of the current loop comparators and two adaptive PLLs that would be required in a four-phase implementation.

Figure 27:
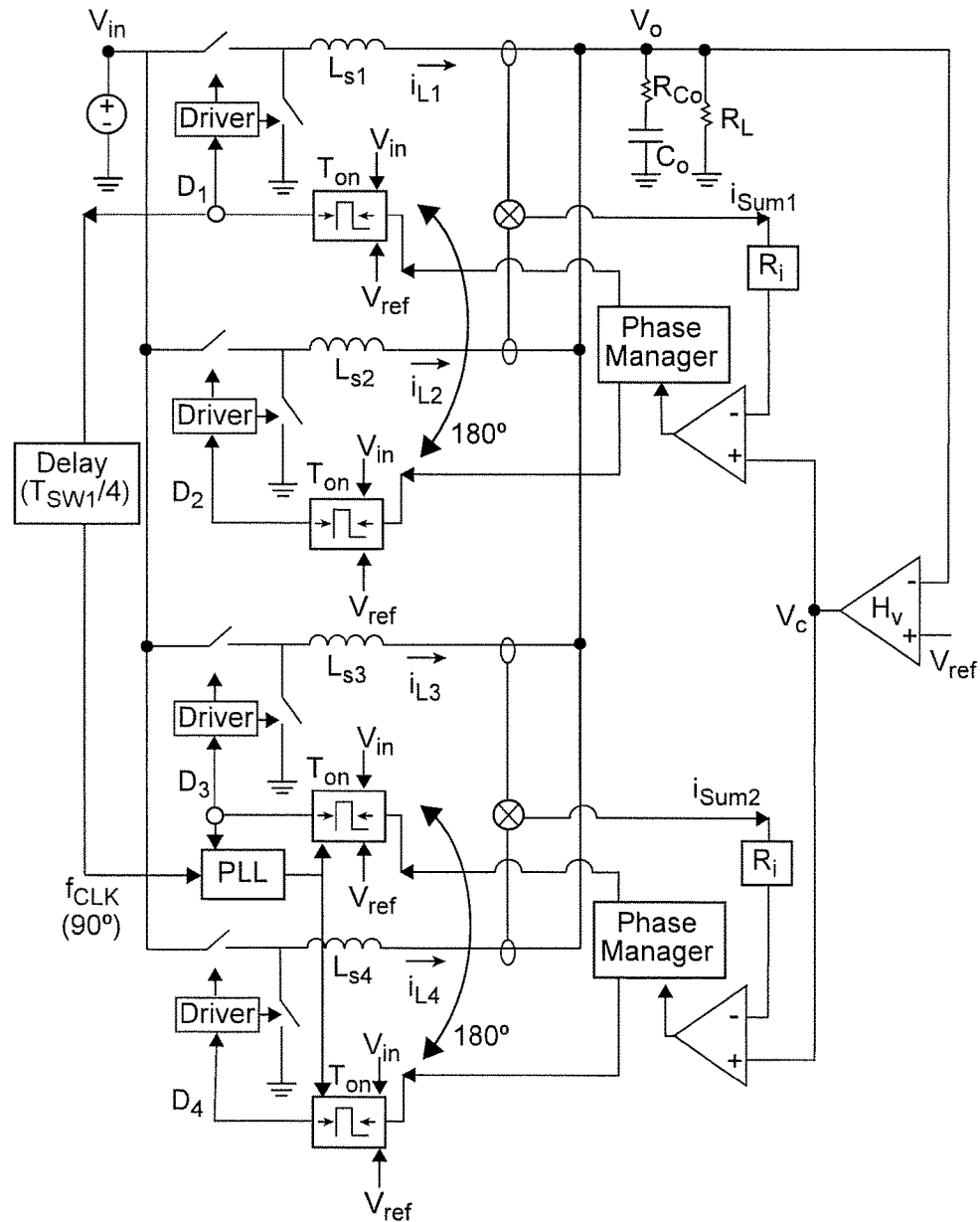

The hybrid interleaving structure of FIG. 26 can be further simplified as shown in FIG. 27 by providing sensed values of $V_{in}$ and $V_{ref}$ to each of the on-time generators. Providing common inputs to the on-time generators of each phase causes $f_{sw}$ of all phases to be substantially identical. Therefore, only one (adaptive or otherwise) PLL is needed to ensure the 90° phase shift between $D_1$ and $D_3$ which can be provided by a delay structure sensing $T_{sw}$ of the first phase and generating a delay of $T_{sw}/4$ (e.g. to a PLL which can be used to correct any error in the phase angle between the two pulse distribution structures; adjusting the third and fourth phases together. Compared with FIG. 26, one additional PLL and one additional clock generator are avoided. However, the $S_r$ of the on time generator in each phase must be modified to adjust the converter operating frequency. For that reason, while the additional simplicity and reduced number of required elements and circuits of the implementation of FIG. 27 may be preferable in many if not most applications, if change (e.g. doubling) of switching frequency was contemplated, the implementation of FIG. 26 would be generally preferred since the change of switching frequency would only require change of frequency of the two fixed frequency clocks whereas change (e.g. doubling) of $S_r$ of each phase would be required in the implementation of FIG. 27.

Figure 28:
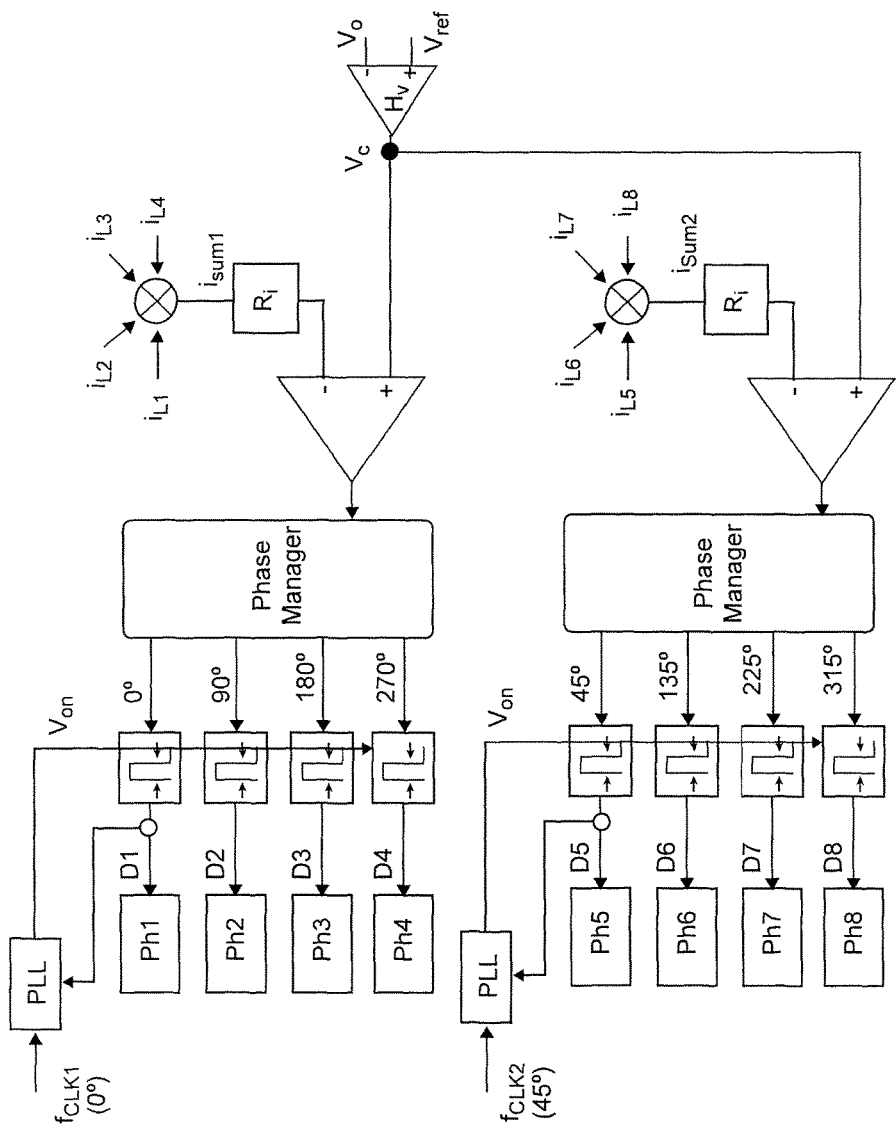
Figure 29:
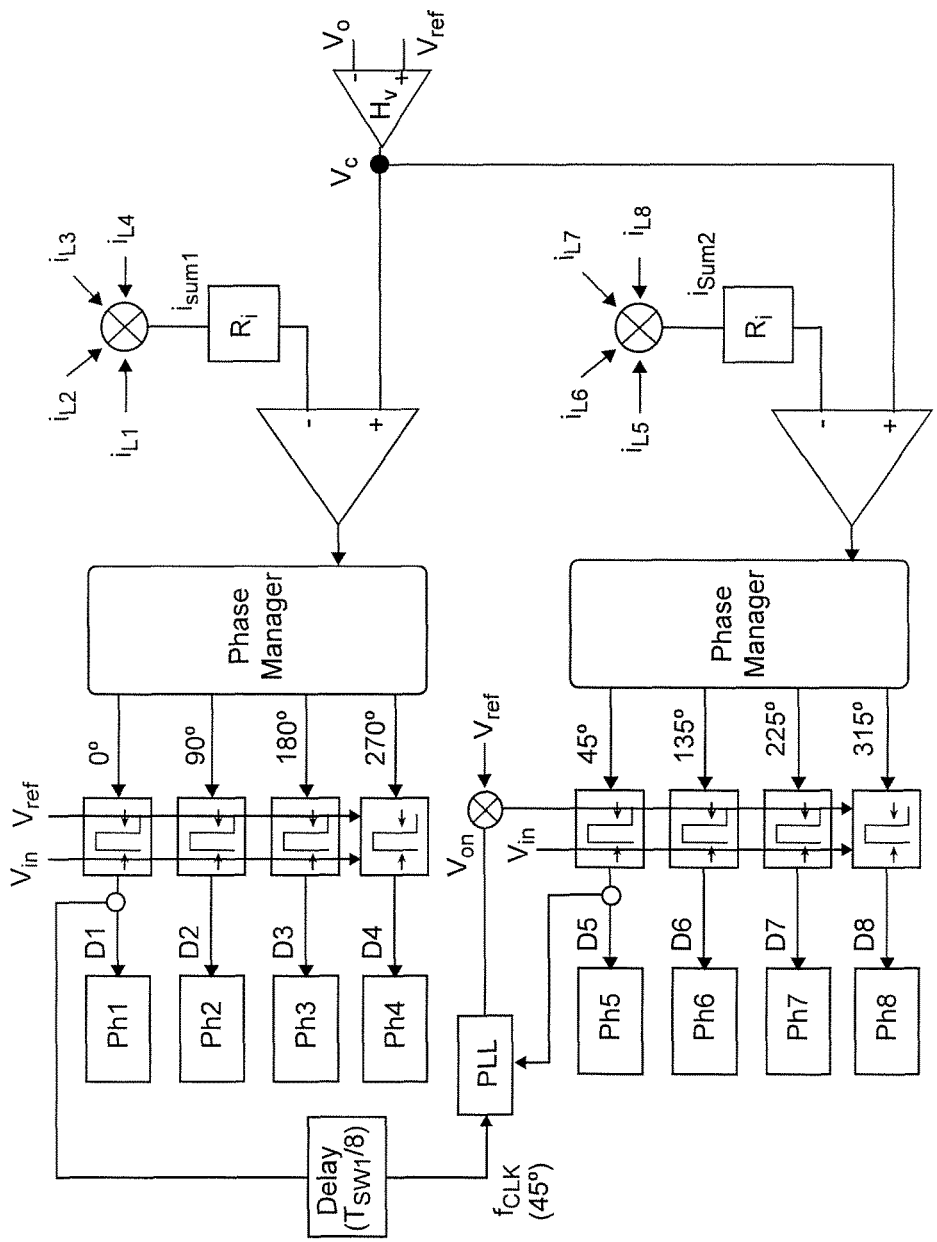

It should be appreciated that such hybrid interleaving can save even more PLLs and related components when the duty cycle of each phase is reduced. For example, a voltage regulator for a server requiring D=0.06~0.15 ($V_{in}$=12 V, Vo=0.5~2.0V) and eight phase operation, the magnitude ratio of $i_{sum}$ to $i_L$ (FIG. 3A) shows that there is no ripple cancellation point within that range of duty cycle, D, in two to five phases. In FIG. 28, a phase manager is shared by each group of four phases such that the phase angles of the first through fourth and fifth through eighth phases are 45°. In such a case only two PLLs (adaptive or otherwise) where one fixed clock is followed by the first phase and $T_{on}$ of the first through fourth phase are adjusted together and the same arrangement is applied to the fifth through eighth phases with the fifth phase following the other fixed frequency clock and $T_{on}$ being adjusted together. Thus, compared with an eight separate phase implementation, six PLLs and six current comparators are avoided although a current sensor is still needed. The further simplification described above in connection with FIG. 27 can also be applied to the eight phase implementation of FIG. 28 as illustrated in FIG. 29.

Figure 30:
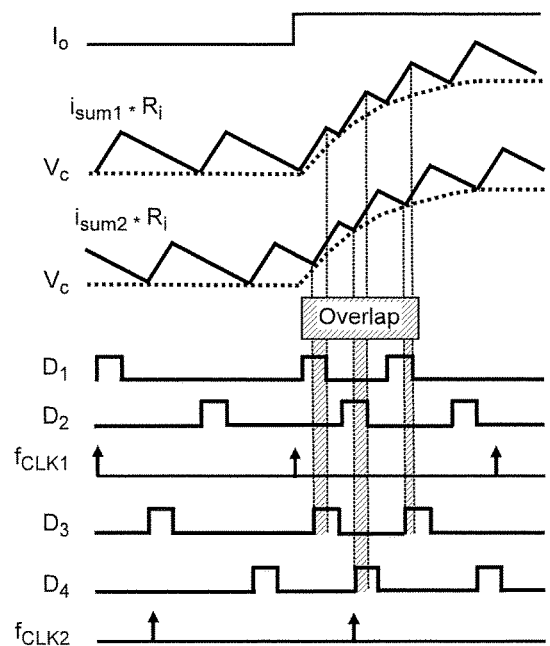
FIG. 30 illustrates waveforms of the transient response of hybrid interleaving.
Figure 31A:
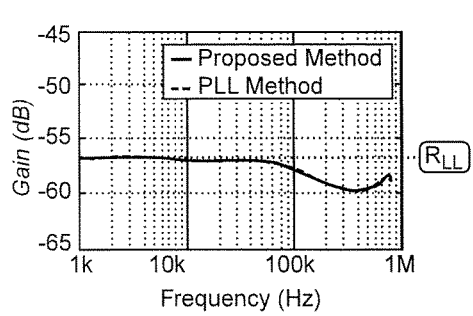
FIGS. 31A and 31B illustrate $Z_{oc}$ over a range of frequencies and voltage at a step-up load transient for the adaptive PLL methodology of the invention.
Figure 31B:
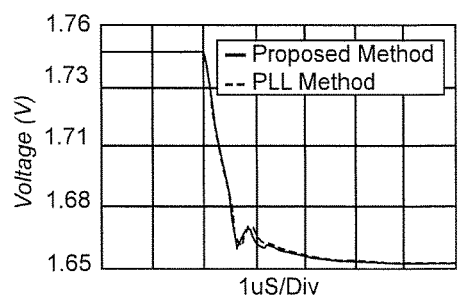

FIG. 30 demonstrates the PFM signals between the two pulse distribution groups can be overlapped naturally during a transient response because the two groups are individually compared with $V_c$. Even though the overlapping is somewhat less in a simulation as compared with an exclusively PLL embodiment, the transient response is comparable as illustrated in FIG. 31.

Figure 33:
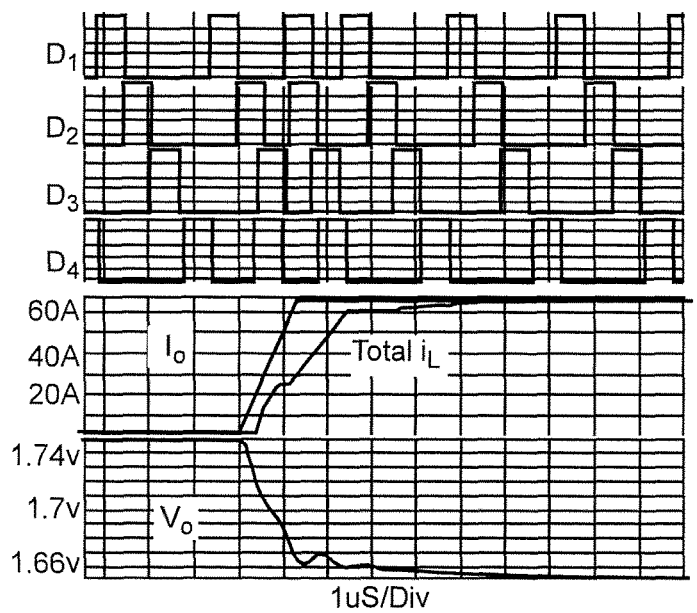
FIG. 33 illustrates pulse overlapping in a four-phase simulation of the invention.

The benefit of hybrid interleaving has been verified by both simulation and experiment with a four phase buck converter in which $L_s$=120 nH, $I_{clk}$=800 KHz and $R_{LL}$=1.5 mΩ and a state of the art output filter for a CPU without bulk capacitors. The output filter has a decoupling capacitor bank outside a CPU socket having eighteen 22 µF capacitors and a cavity capacitor bank having a capacitance of eighteen 22 µF capacitors. The delay effect of a practical COT control loop and propagation delay was 50 nS and minimum off-time was 150 nS based on a commercially available COT controller. A simulation shown in FIG. 32 demonstrates that the simulated structure can achieve a high $T_2$ design bandwidth of 120 KHz over a wide range of duty cycle, D, and constant output impedance (possible only if phase margin is sufficient) for adaptive voltage positioning (AVP) with simple type I (Hv) compensation of $H_v$. Another simulation condition with D=0.25 ($V_{in}$=7 V, Vo=1.75 V), step load change from 1 A to 66 A with a slew rate of 100 A/µS illustrated in FIG. 33 indicates the duty cycle overlapping of hybrid interleaving enables more rapid transient response in the sharper slope of total inductor current in power delivery to the load.

Figure 34:
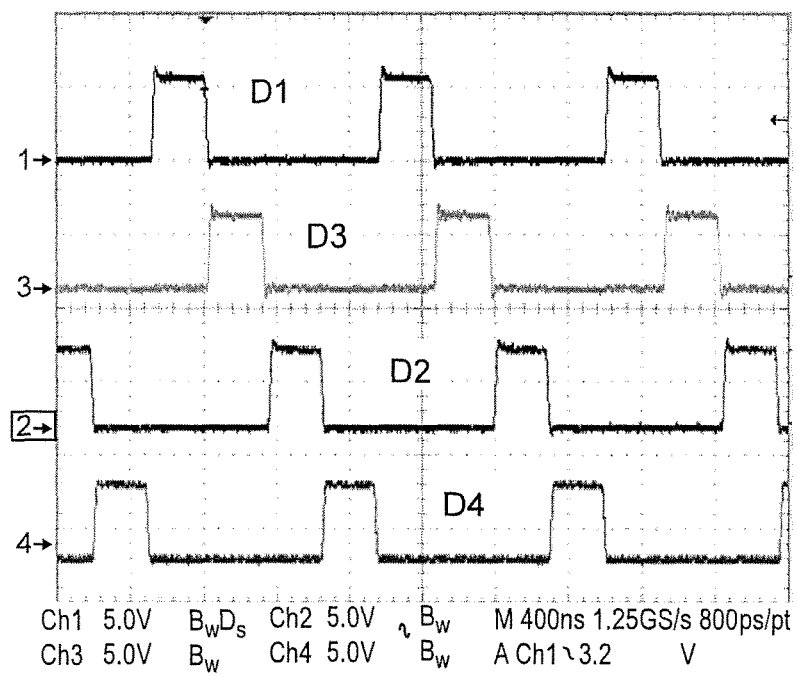
FIG. 34 illustrates four-phase steady state operation of an experimental result of the invention at a duty cycle of 0.25.
Figure 35:
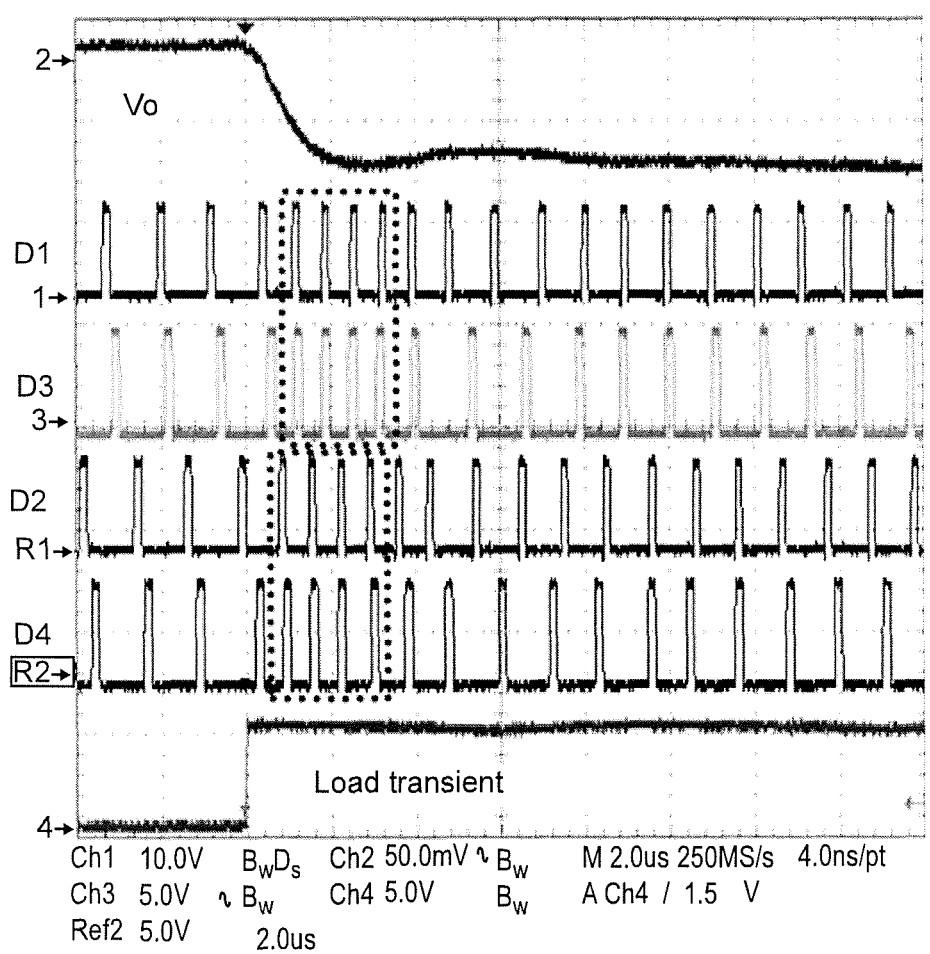
FIG. 35 illustrates duty cycle overlapping during a load transient in an experimental result of the invention.

An experimental platform has been built on a computer mother board with two phase managers in a COT controller with one delay circuit and one adaptive PLL on a daughter board. The measured steady state waveform illustrated in FIG. 35A demonstrates that the correct interleaving angle is achieved with stable PFM signals at D=0.25 in four phase operation. As noted above, this duty cycle in four-phase operation is a ripple cancellation point which would suffer severe duty cycle jitter in the absence of the invention but FIG. 34 demonstrates that hybrid interleaving in accordance with the invention works well. The experimental transient condition is $V_{in}$=7 V, Vo=1.2 V, and step load changes from 1 A to 51 A. The measured PFM signals in FIG. 35 demonstrates that the duty cycle overlaps between $D_1$ and $D_3$ as well as between $D_2$ and $D_4$. Therefore, the undershoot of transient response is reduced to less than 15 mV to meet the most stringent recent voltage regulator specifications.

Figure 38:
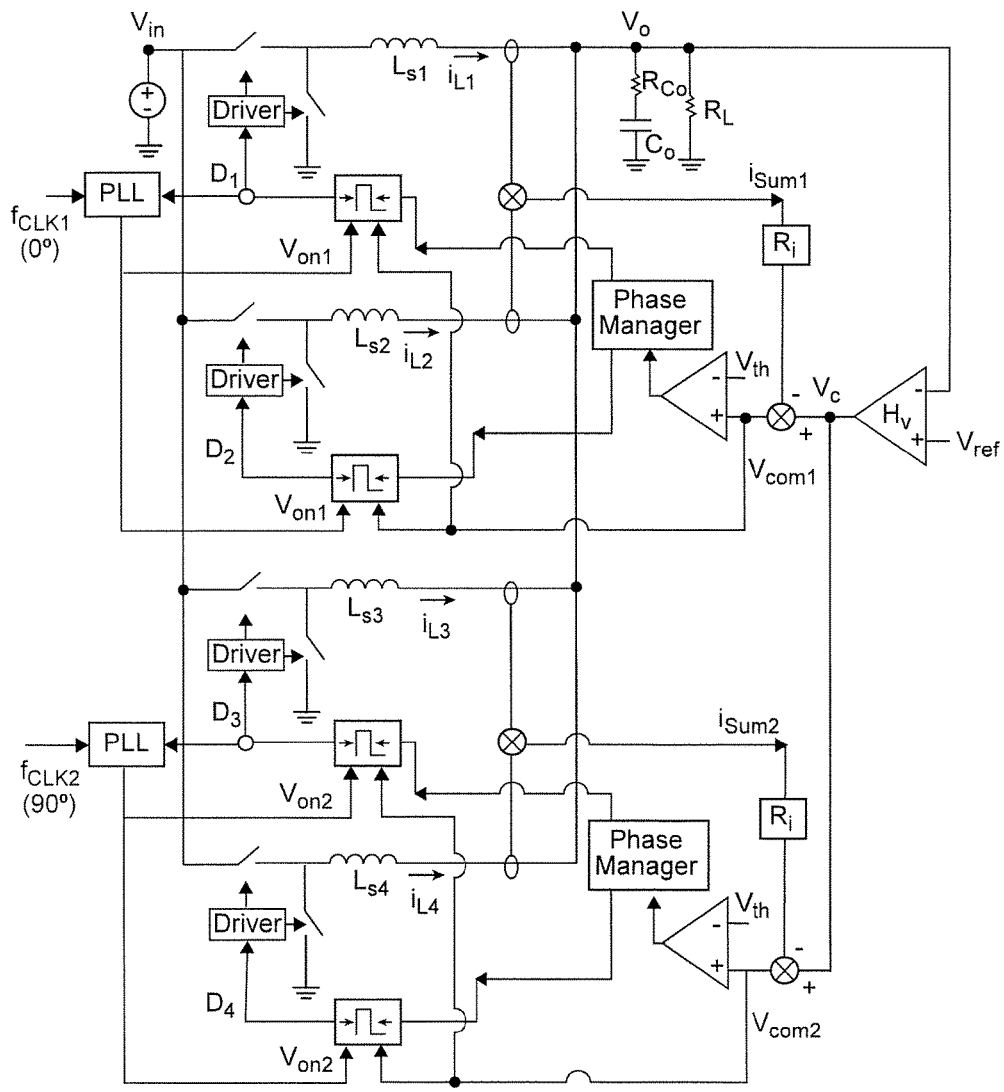
FIG. 38 is a schematic diagram of four-phase RPM control with simplified hybrid interleaving.

FIGS. 36 and 37 demonstrate the operating principle of hybrid interleaving for RPM control as discussed above and hysteresis control, respectively, in four phase operation. in the hybrid interleaving of RPM control, one PLL adjusts the ramp slope of the on-time generators, $S_1$ and $S_2$, of the first and second phases to force the phase angles of $D_1$ to 0° while another PLL adjusts the ramp slope of the corresponding on-time generator, $s_3$ and $S_4$ of the third and fourth phases to force the phase angle of $D_3$ to 90°. the hybrid interleaving of hysteresis control adjusts the hysteresis bands ($V_H$) of each of two hysteretic comparators to achieve a 90° delay between the first and third phases. The block diagrams of these arrangements are shown in FIGS. 38 and 39, respectively.

In view of the foregoing, it is clearly seen that the invention provides a solution for multi-phase power converters to the jittering and ripple cancellation issues, improved transient response, improved stability for high bandwidth design of the output voltage feedback loop, extendibility to other variable frequency control techniques beyond COT, guaranteed stability of PLLs and much simplified and reduced required circuitry.

While the invention has been described in terms of a single preferred embodiment, those skilled in the art will recognize that the invention can be practiced with modification within the spirit and scope of the appended claims.

The invention claimed is:

1. A multi-phase power converter including
two single phase power converters connected in parallel between a source of input power and output, wherein each of said single phase power converters includes
a switch connected in series with an inductor between said source of input power and said output,
an error amplifier for comparing a voltage at said output with a reference voltage and providing a control voltage,
a comparator for comparing a signal representing ripple of voltage or current at said output and said control voltage, and
an on-time generator responsive to an output of said comparator to determine a duty cycle at which said switch is conductive,
wherein said multi-phase power converter further includes
an adaptive phase-locked loop (PLL) arrangement including a phase-frequency detector wherein said adaptive phase-locked loop arrangement maintains a bandwidth at a point of phase margin such that said phase locked loop is unconditionally stable over changes in said duty cycle and provides interleaving of on-time periods and pulse frequency modulated signal outputs of said two single phase power converter.

2. The multi-phase power converter as recited in claim 1, wherein said multi-phase power converter includes four phases.

3. The multi-phase power converter as recited in claim 1, wherein said multi-phase power converter includes eight phases.

4. The multi-phase power converter as recited in claim 1 wherein said duty cycle varies with at least one of voltage of said source of input power, voltage at said output and a reference clock frequency of said adaptive PLL arrangement.

5. The multi-phase power converter as recited in claim 4, wherein said ramp voltage waveform generated by said ramp signal generator varies said slope of said ramp voltage waveform inversely with variation of said duty cycle.

6. The multi-phase power converter as recited in claim 5, wherein said ramp voltage waveform has a piecewise linear slope that varies with time.

7. The multi-phase power converter as recited in claim 6, wherein said piecewise linear slope of said ramp voltage waveform is developed by a plurality of sequentially switched current mirrors.

8. The multi-phase power converter as recited in claim 7, wherein sequential switching of said sequentially switched current mirrors is responsive to a tapped delay line.

9. The multi-phase power converter as recited in claim 4, wherein a ratio of an output of said phase frequency detector and a linear output of said ramp generator is adjusted to cancel changes in said voltage of said source of input voltage and said voltage at said output of said multi-phase power converter and a voltage corresponding to said reference voltage is adjusted to cancel changes in frequency of said reference clock.

10. The multi-phase power converter as recited in claim 9, wherein said voltage corresponding to said reference voltage is developed by applying a transfer function to said reference voltage.

11. The multi-phase power converter as recited in claim 10, wherein said transfer function is applied to said reference voltage using an amplifier having controllable gain.

12. The multi-phase power converter as recited in claim 11 wherein gain of said amplifier having controllable gain is controlled by a decoder.

13. The multi-phase power converter as recited in claim 12, wherein said decoder decodes a signal representing frequency, $f_{clk}$, of said reference clock and outputs a signal corresponding to $f_{clk}^2$.

14. The multi-phase power converter as recited in claim 1, wherein said multi-phase power converter, operating at steady-state, operates by one of a constant on-time control, ramp pulse modulation control and hysteresis control mode.

15. The multi-phase power converter as recited in claim 1, wherein more than two single phase power converters are connected in parallel, said multi-phase power converter further including
a phase manager structure for further interleaving on-time periods of said more than two single phase power converters.

16. The multi-phase power converter as recited in claim 15, wherein said phase manager interleaves control signals to on-time generators corresponding to each of a plurality of said PLL arrangements.

17. The multi-phase power converter as recited in claim 15, wherein said phase manager interleaves control signals to on time generators corresponding to a PLL and a phase delay from said PLL.

18. A multi-phase power converter including
two groups of single phase power converters connected in parallel between a source of input power and output, wherein each group of said single phase power converters is synchronized with a clock of a different phase using at least one phase locked loop, wherein each said single phase power converter includes
a switch connected in series with an inductor between said source of input power and said output,
an error amplifier for comparing a voltage at said output with a reference voltage and providing a control voltage,
a comparator for comparing a signal representing ripple of voltage or current at said output and said control voltage to provide pulses to control said switch, and an on-time generator responsive to an output of said comparator to determine a duty cycle at which said switch is conductive, wherein said multi-phase power converter further includes a pulse distribution structure distributing pulses output by said comparator to the on-time generator to control respective switches of each respective said group of single phase power converters.

* * * * *